United States Patent
Shook

(10) Patent No.: US 9,130,560 B2
(45) Date of Patent: Sep. 8, 2015

(54) EDGE RATE CONTROL GATE DRIVE CIRCUIT AND SYSTEM FOR LOW SIDE DEVICES WITH DRIVER FET

(71) Applicant: Texas Instruments Incorporated, Dallas, TX (US)

(72) Inventor: Adam L. Shook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 403 days.

(21) Appl. No.: 13/754,468

(22) Filed: Jan. 30, 2013

(65) Prior Publication Data

US 2013/0234695 A1    Sep. 12, 2013

Related U.S. Application Data

(60) Provisional application No. 61/592,056, filed on Jan. 30, 2012.

(51) Int. Cl.
*H03K 19/003* (2006.01)
*G05F 3/16* (2006.01)
*H03K 5/12* (2006.01)

(52) U.S. Cl.
CPC ............ *H03K 19/00361* (2013.01); *G05F 3/16* (2013.01); *H03K 5/12* (2013.01); *H03K 19/00384* (2013.01)

(58) Field of Classification Search
CPC .................. H03K 19/00361; H03K 19/00384
USPC ..................................................... 327/108–112
See application file for complete search history.

(56) References Cited

U.S. PATENT DOCUMENTS

| | | | |
|---|---|---|---|
| 5,656,960 A * | 8/1997 | Holzer | 327/170 |
| 6,281,730 B1 * | 8/2001 | Vu | 327/170 |
| 2005/0174099 A1 * | 8/2005 | Ohkubo et al. | 323/315 |
| 2006/0290416 A1 * | 12/2006 | Florescu | 327/543 |

FOREIGN PATENT DOCUMENTS

DE          19547778 C1 *    5/1997

* cited by examiner

*Primary Examiner* — Timothy J Dole
*Assistant Examiner* — Ishrat Jamali
(74) *Attorney, Agent, or Firm* — Alan A. R. Cooper; Frank D. Cimino

(57) ABSTRACT

An apparatus, comprising a load; an output FET having a drain coupled to the load; a first and second of a pair strong FETs, wherein: a) a source of the first of the pair of the strong FETs is coupled to the load; b) a drain of the first pair of the strong FETs is coupled to the source of the second of the of the pair of the strong FETs; the drain of the second pair of the strong FETs is coupled to a gate of the output FET; and a fixed current mirror is coupled to the gate of the first of the pair of the strong FETs.

20 Claims, 38 Drawing Sheets

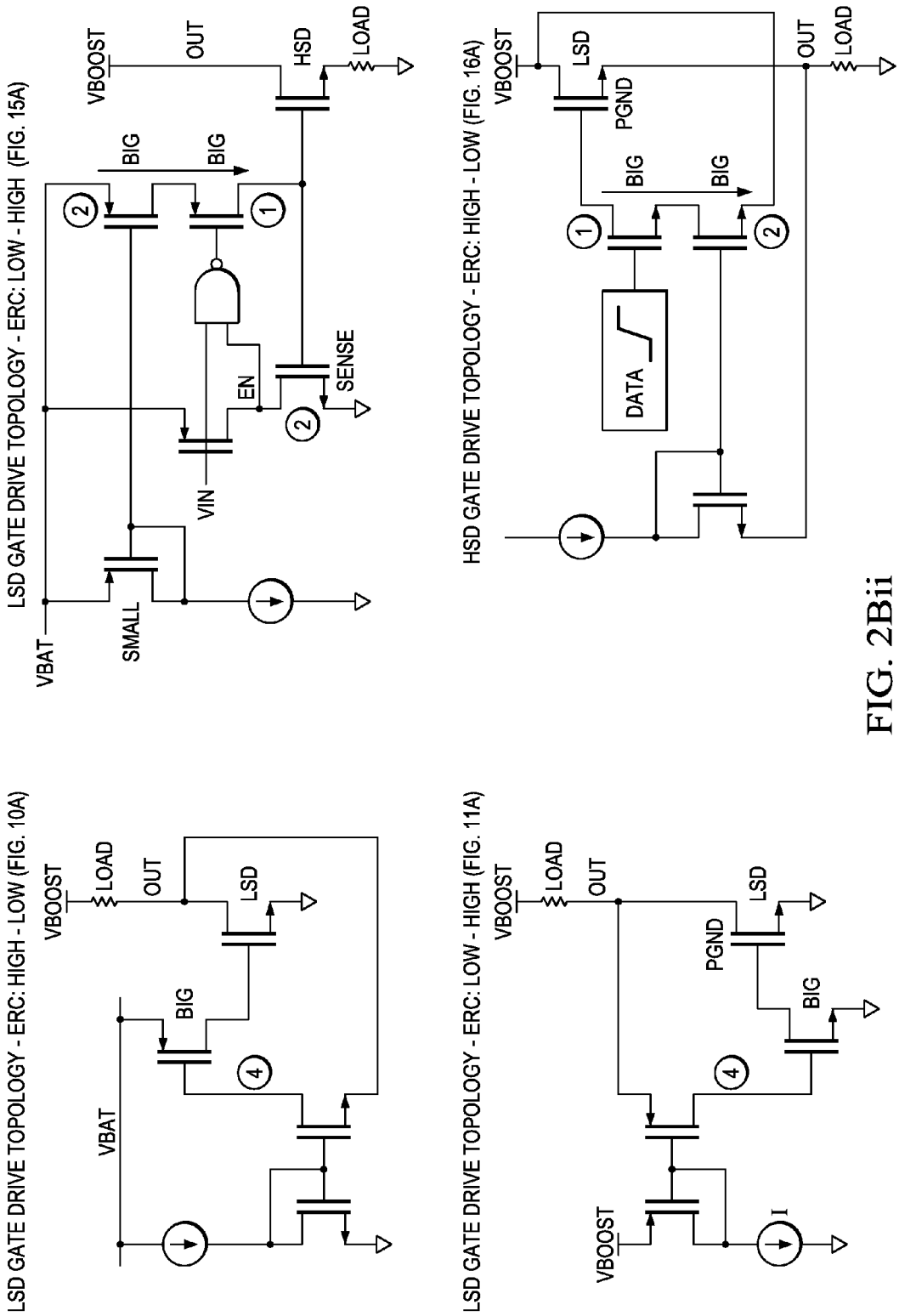
FIG. 2Bii

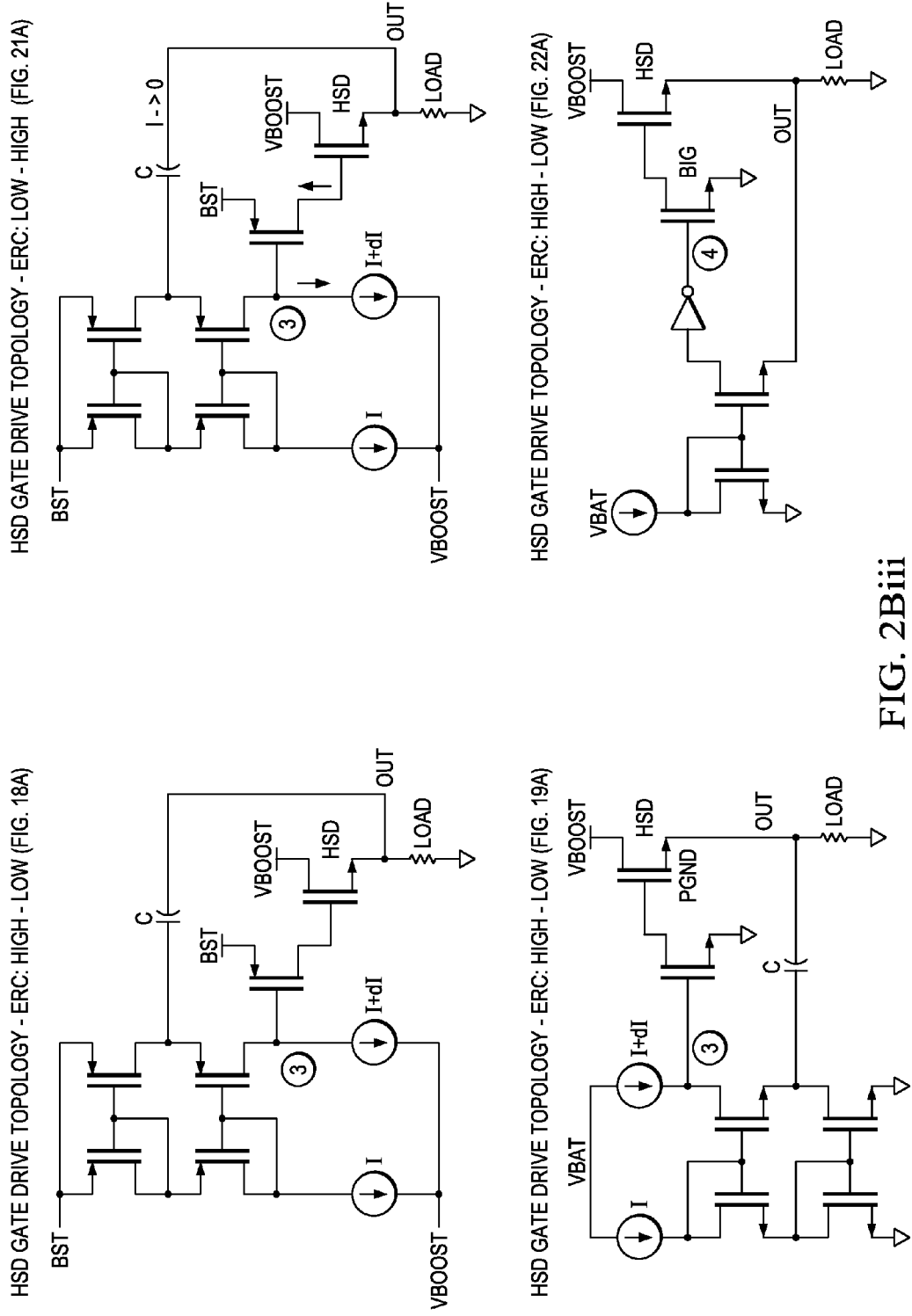
FIG. 2Biii

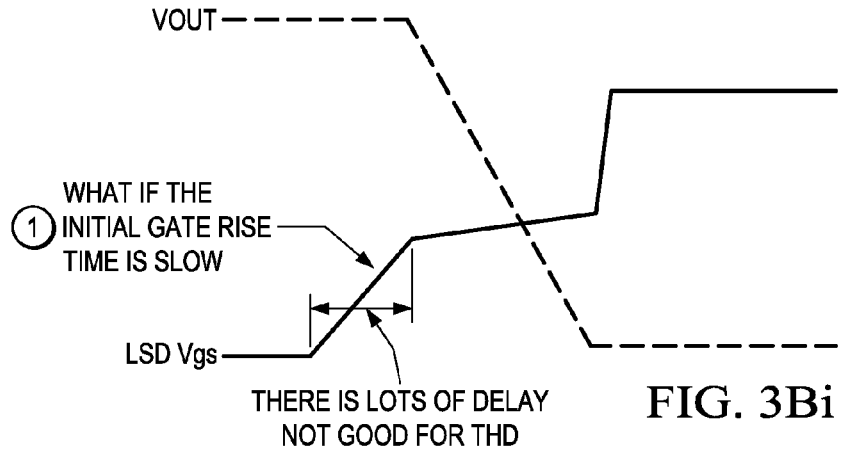
FIG. 3Bi
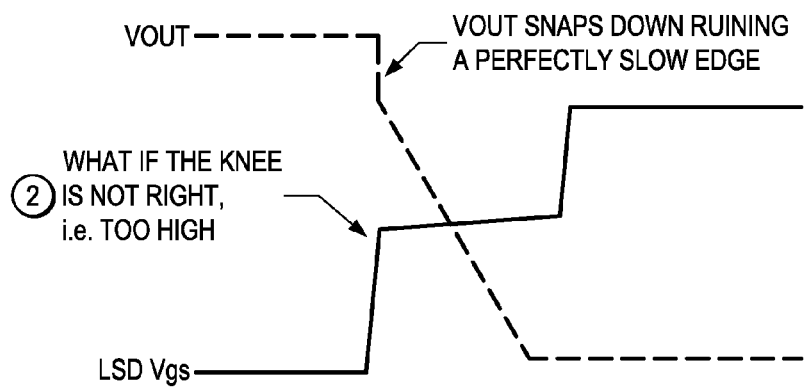
FIG. 3Bii

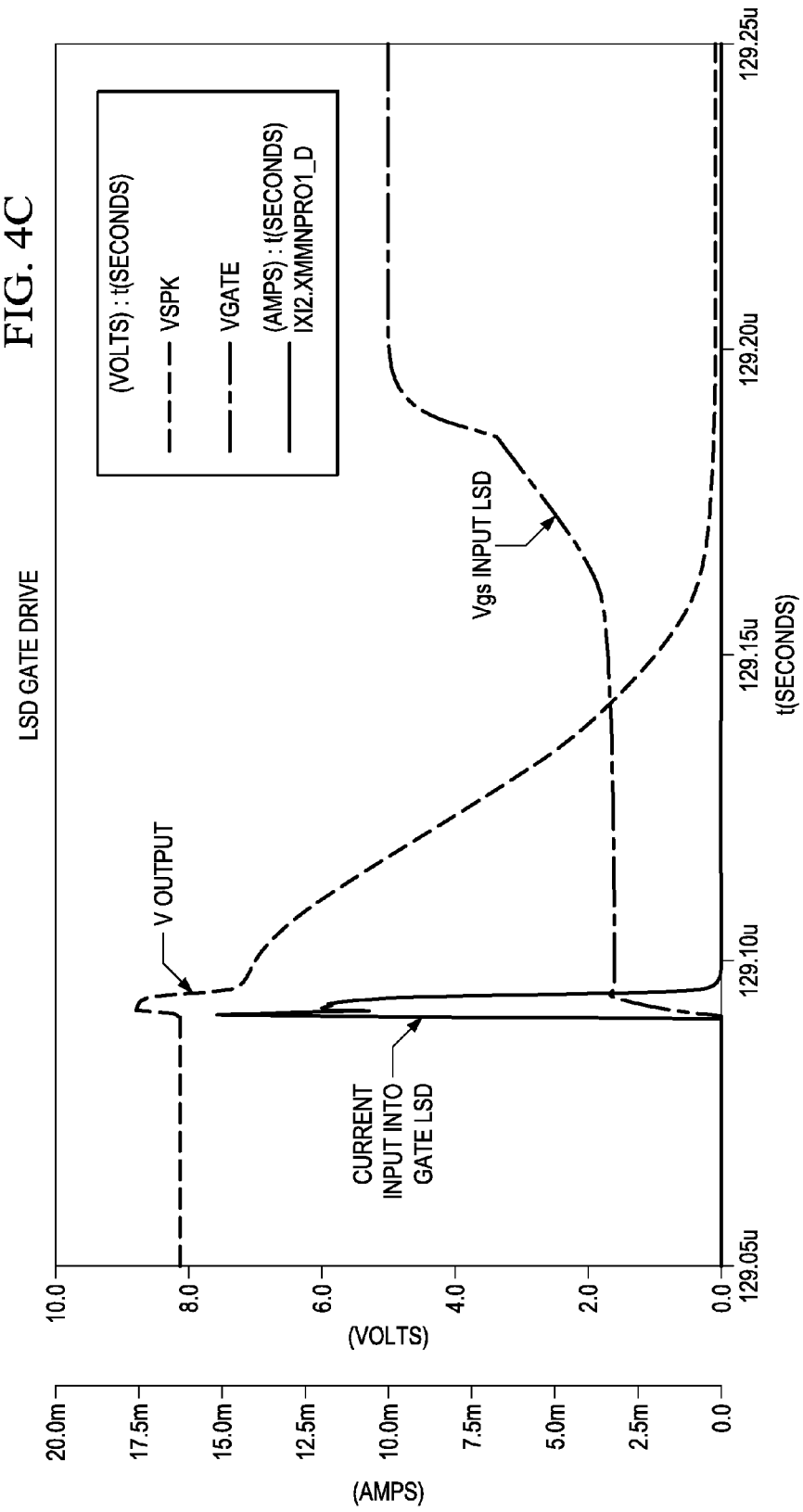

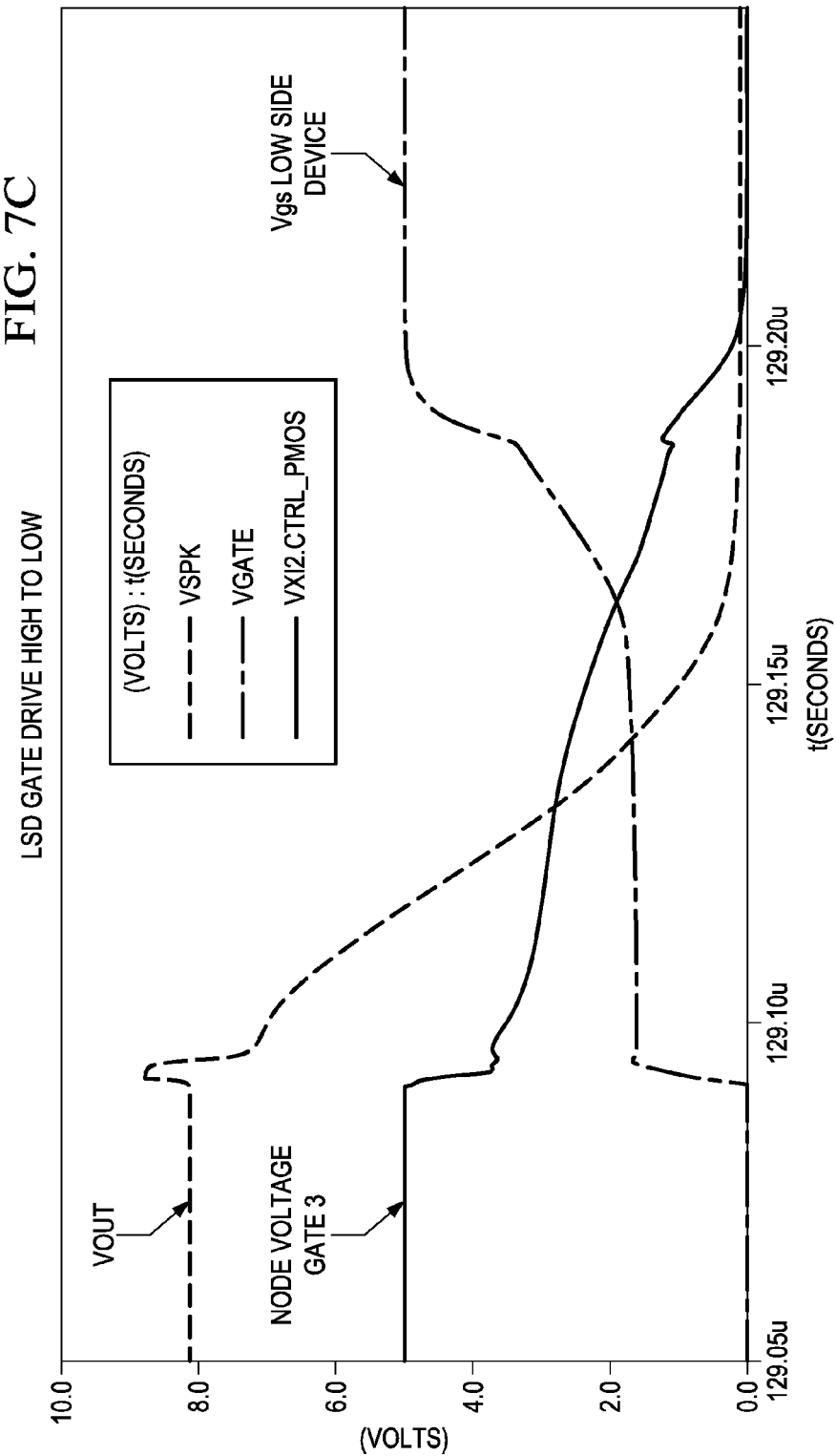

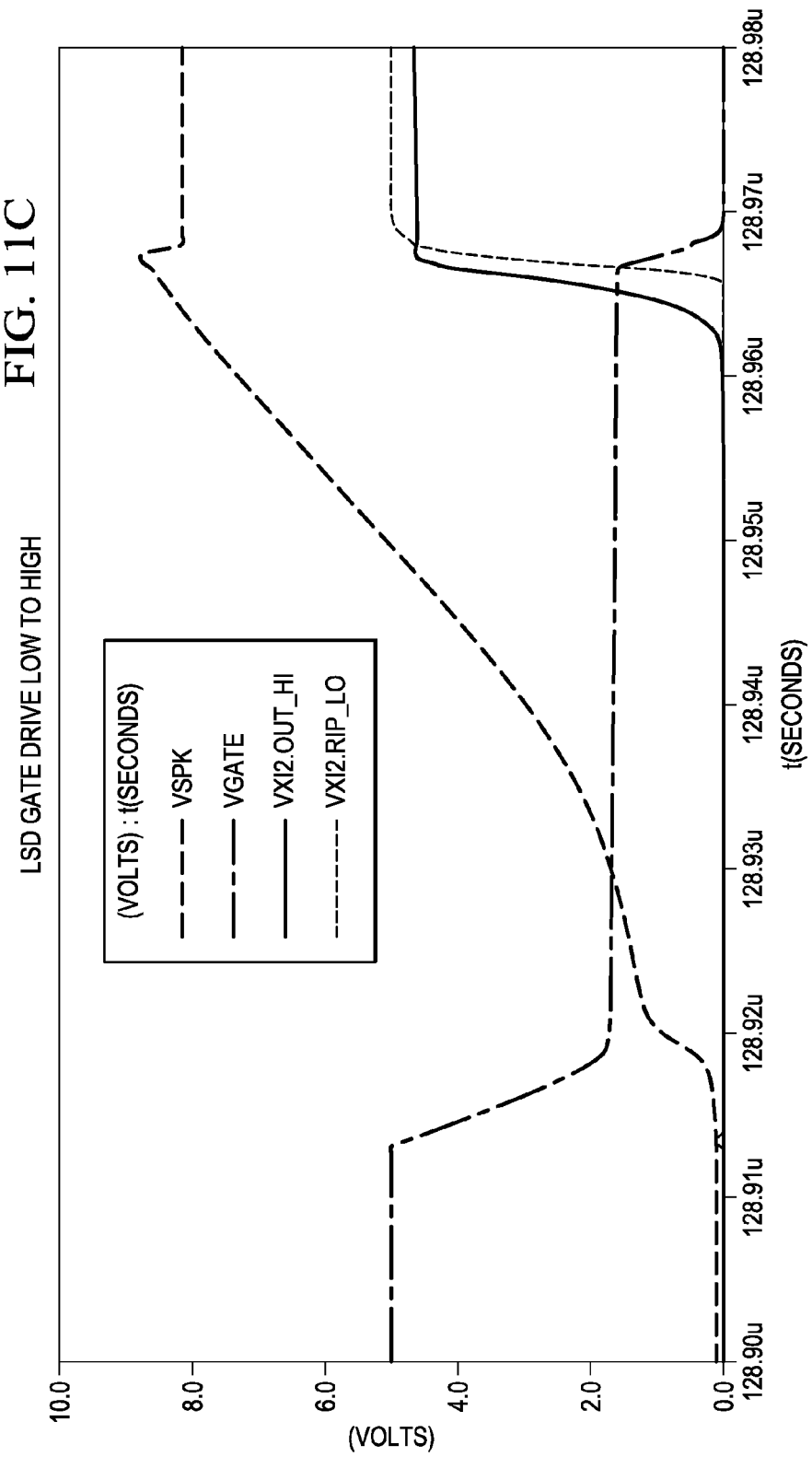

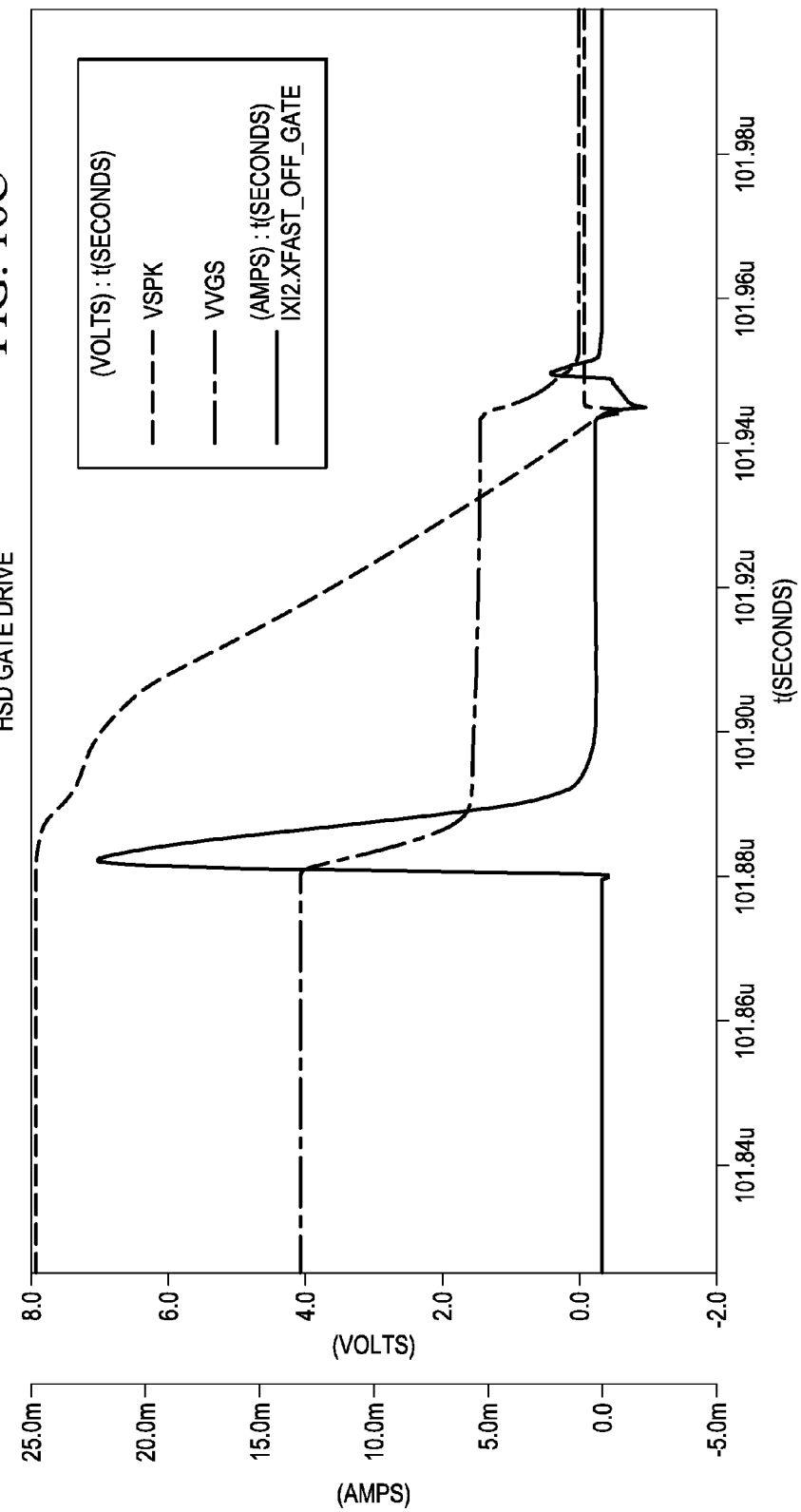

dI/C = dV/dt
③ CAPACITIVE FEEDBACK INJECT A CURRENT CONTROLLING THE SLEW RATE AT THE OUTPUT. IF THE SLEW RATE IS TOO HIGH THE CHARGING FET IS TURNED OFF, IF THE SLEW RATE IS TOO LOW THE PROGRAMMABLE dI TURNS THE DRIVING FET ON HARD. STRENGTH OF THE CHARGING FET IS RELATIVELY WEAK

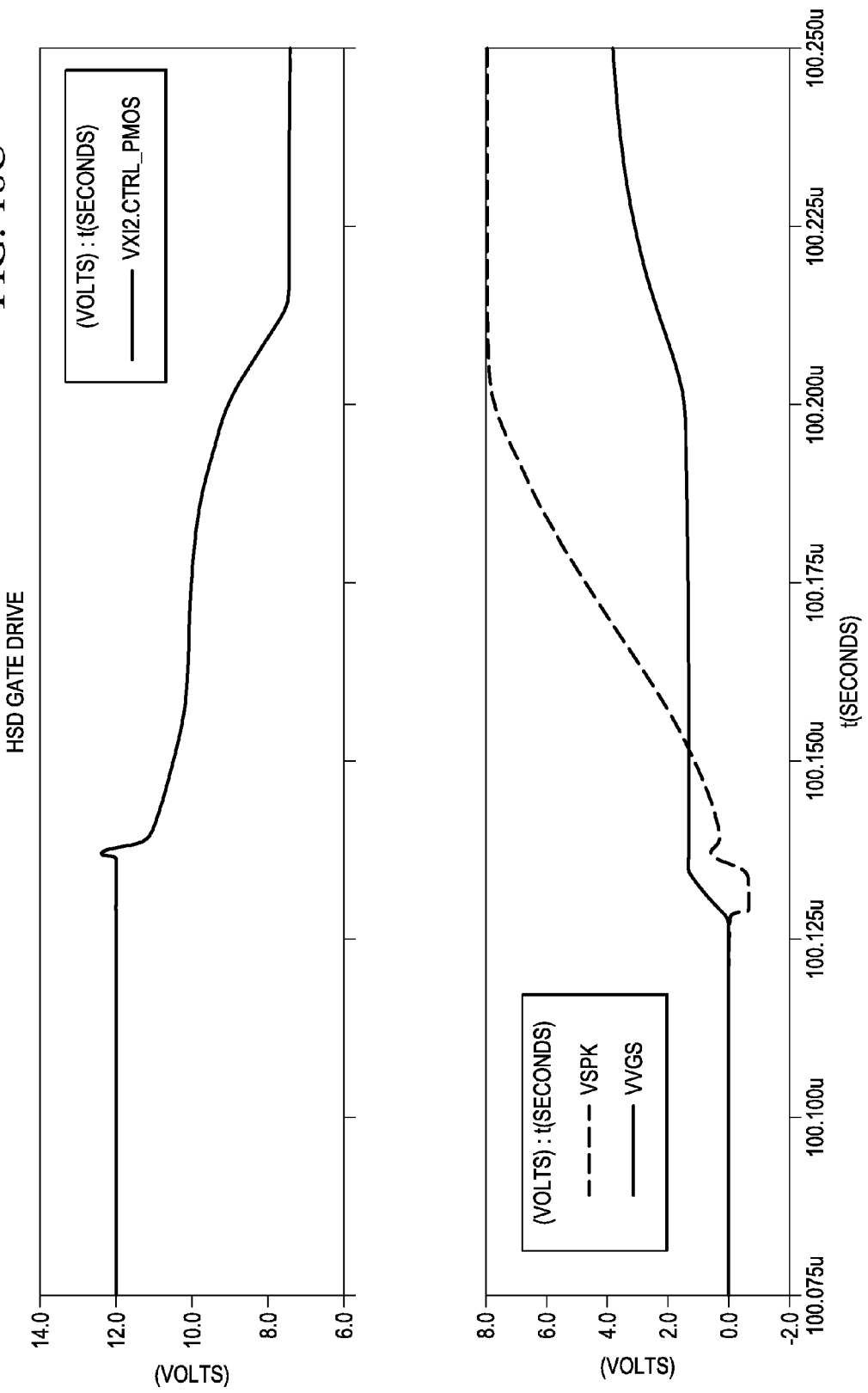

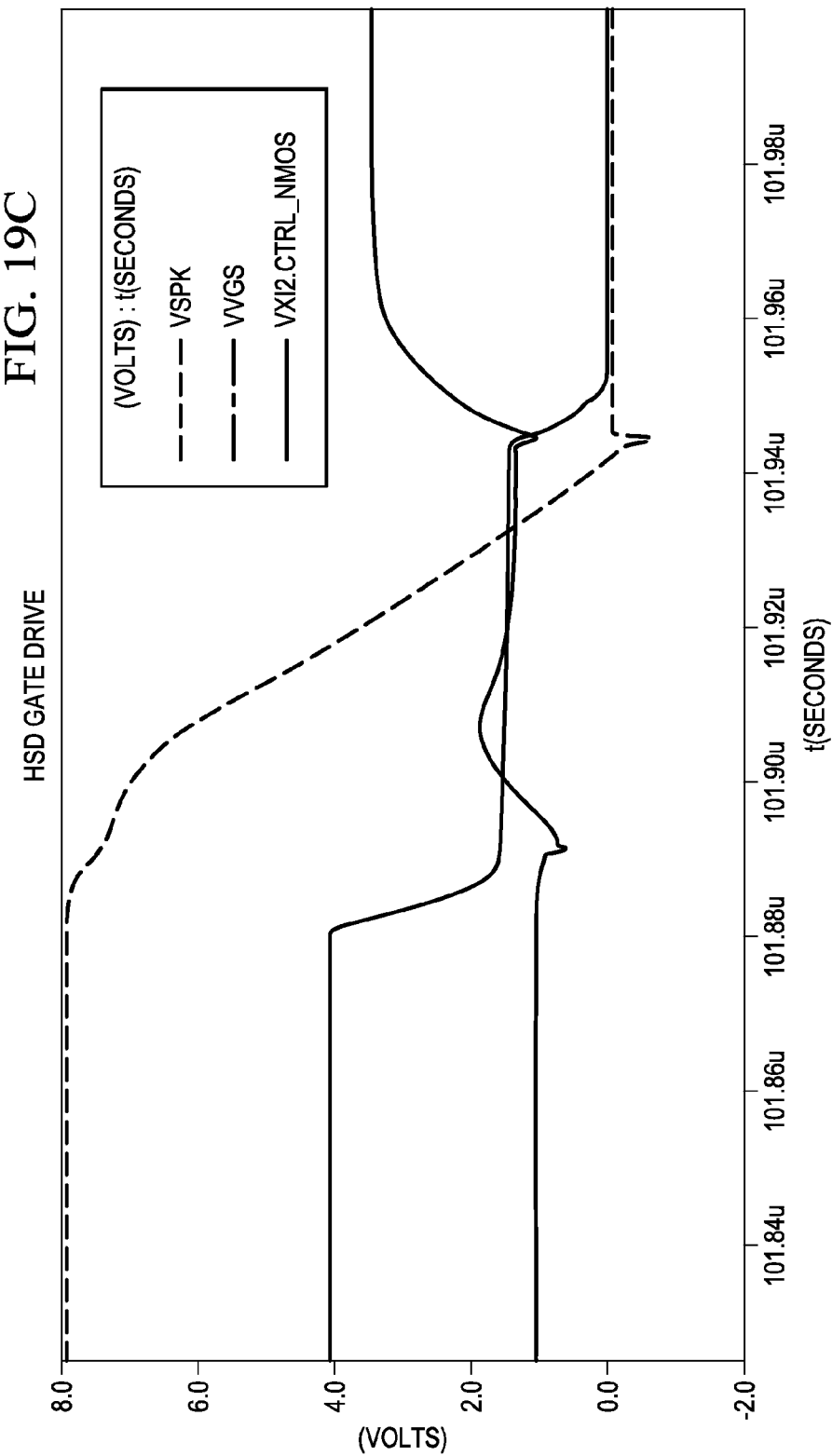

④ CAPACITIVE FEEDBACK INJECT STOPS WHEN VOUT IS HIGH AND THE PMOS GATES FALLS

WE CAN ALSO USE THE COMMON GATE COMPARATOR FROM THE LOWSIDE GATE DRIVE TO DETECT WHEN THE OUTPUT IS HIGH. THEN TURN ON A BIG PULL FET NOT SHOWN

HSD GATE DRIVE TOPOLOGY - ERC: HIGH - LOW

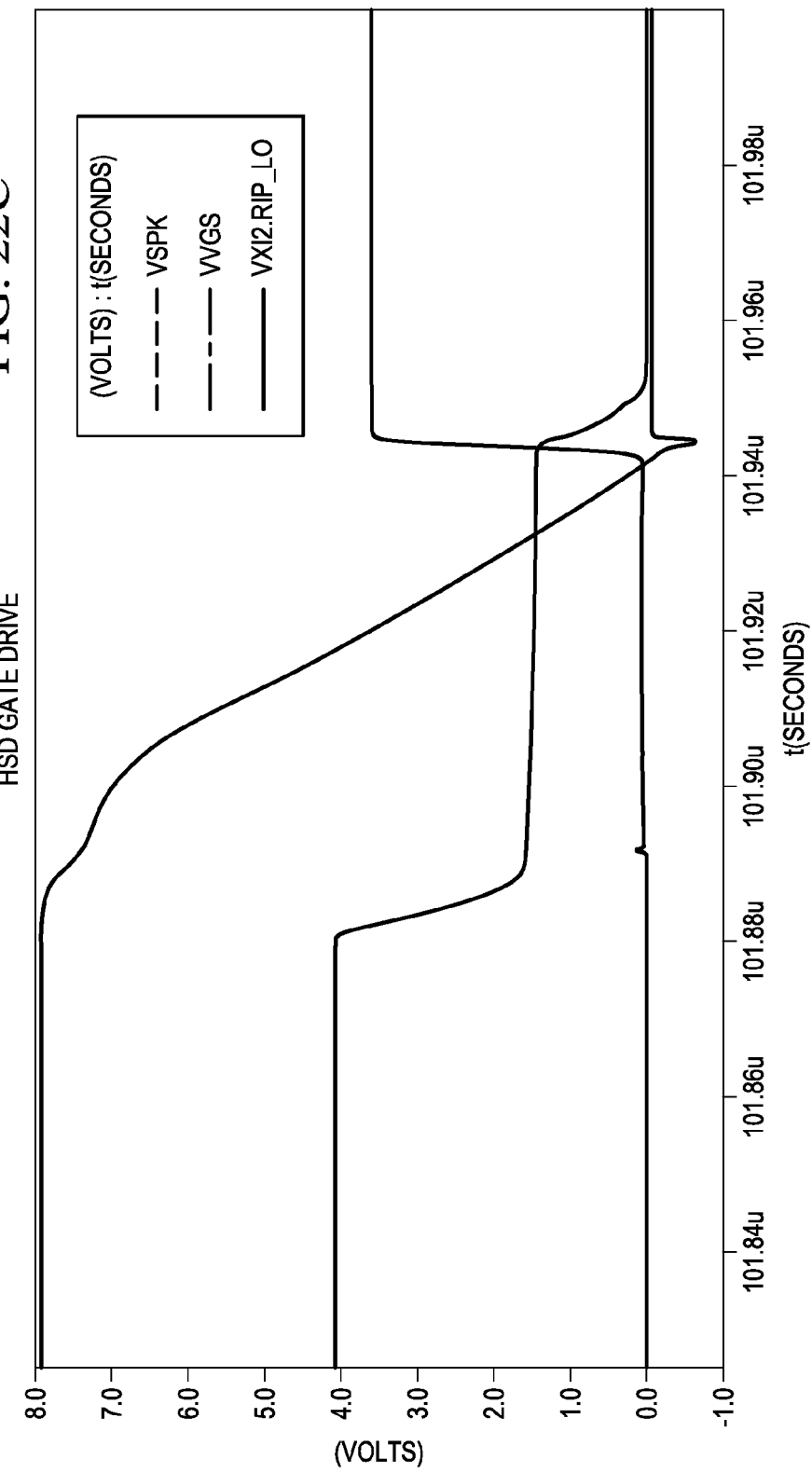

| | | | | | | | | TRANSITION TIME (ns) | |
|---|---|---|---|---|---|---|---|---|---|
| | | | C | 100.0E-15 | | | | | |
| BIT 2 | BIT 1 | BIT 0 | dI | | | | | TARGET | SIM |
| 40E-6 | 12E-6 | 4E-6 | 16E-6 | Dv | Dt | Dv/Dt | | | |
| 0 | 0 | 0 | 16E-6 | 8 | 50 | 160.0E+6 | | 50 | 55 |
| 0 | 0 | 1 | 20E-6 | 8 | 40 | 200.0E+6 | | 40 | 40 |
| 0 | 1 | 0 | 28E-6 | 8 | 29 | 280.0E+6 | | 29 | 23 |
| 0 | 1 | 1 | 32E-6 | 8 | 25 | 320.0E+6 | | 25 | 19 |
| 1 | 0 | 0 | 56E-6 | 8 | 14 | 560.0E+6 | | 14 | 11 |
| 1 | 0 | 1 | 60E-6 | 8 | 13 | 600.0E+6 | | 13 | 10 |
| 1 | 1 | 0 | 68E-6 | 8 | 12 | 680.0E+6 | | 12 | 8 |
| 1 | 1 | 1 | 72E-6 | 8 | 11 | 720.0E+6 | | 11 | 7 |
FIG. 24
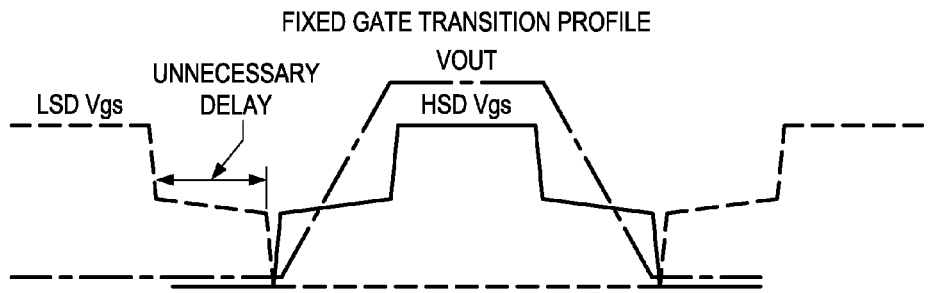
FIG. 25A
(PRIOR ART)
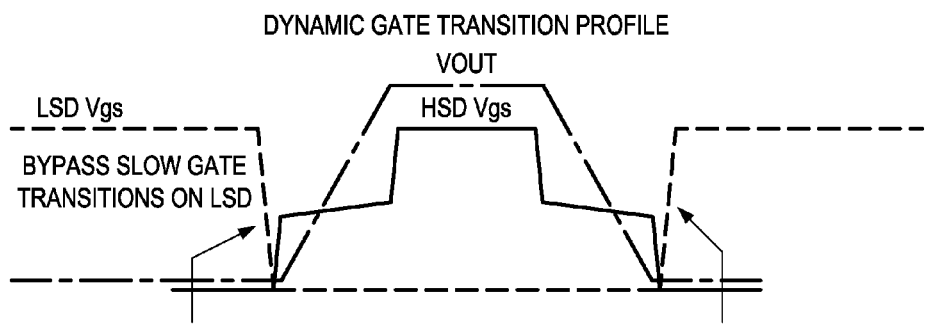
FIG. 25B

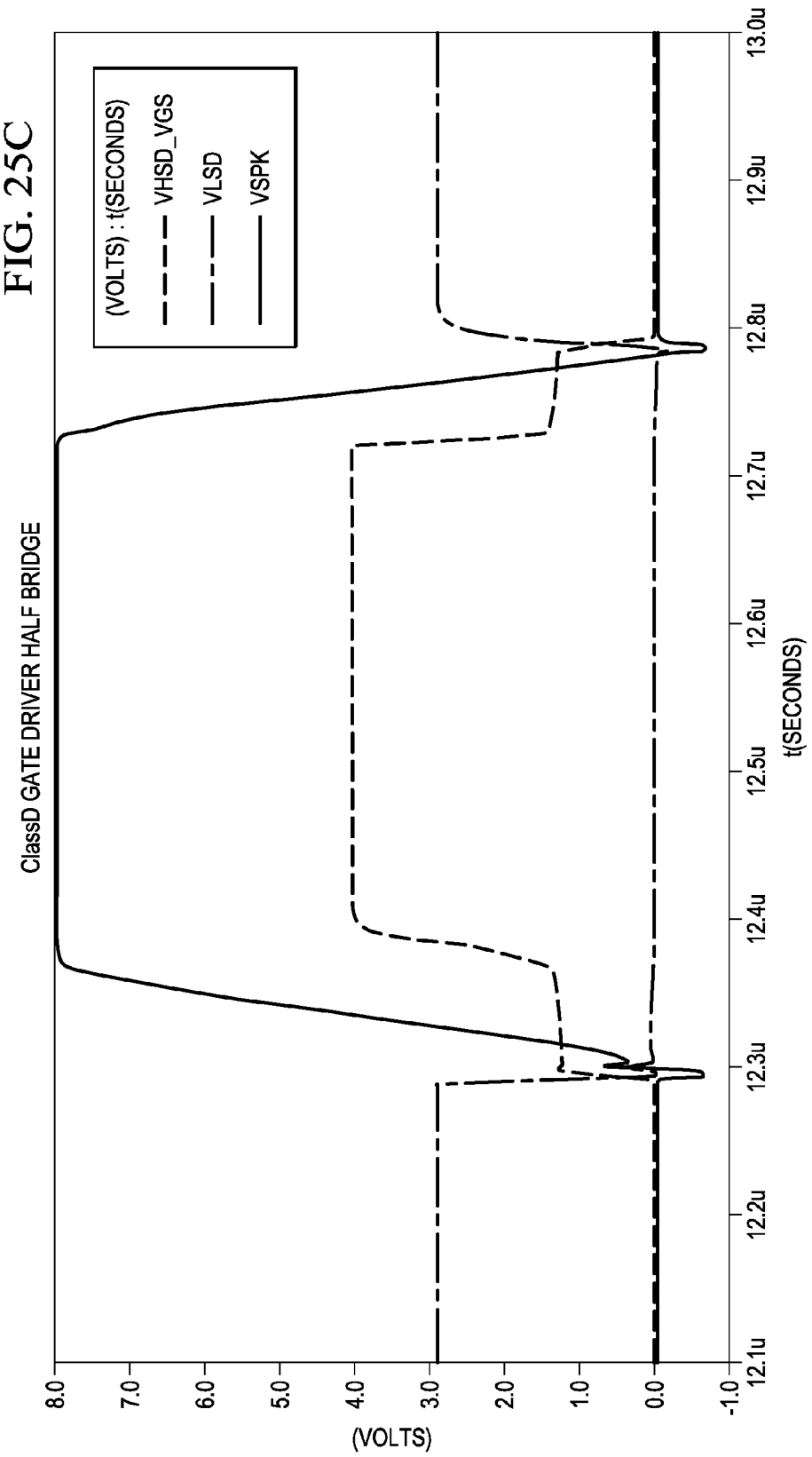

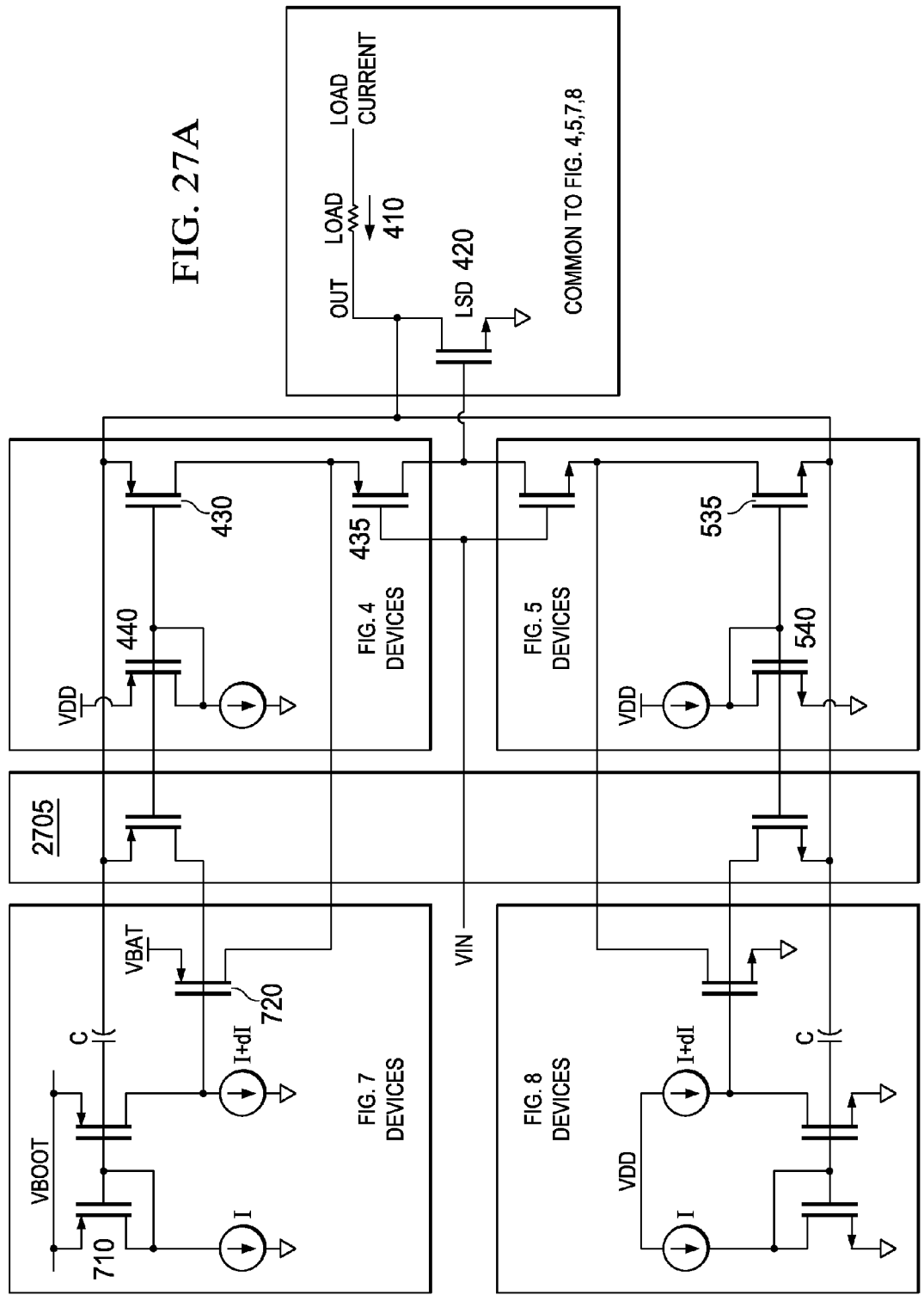

EDGE RATE CONTROL GATE DRIVE CIRCUIT AND SYSTEM FOR LOW SIDE DEVICES WITH DRIVER FET

PRIORITY

This application claims priority to U.S. Provisional Application No. 61/592,056, filed Jan. 30, 2012, entitled "Edge Rate Control Gate Drive Circuit for Switching Power", which is incorporated by reference in its entirety, and is related to U.S. Nonprovisional application Ser. No. 13/754,543, entitled "Edge Rate Control Gate Drive Circuit and System for Low Side Devices with Capacitor" (TI-73440) and U.S. Nonprovisional application Ser. No. 13/754,578, entitled "Edge Rate Control Gate Drive Circuit and System for High and Low Side Devices with Large Driver FET," (TI-73441).

TECHNICAL FIELD

This application is directed, in general, to edge rate control circuits and, more specifically, to edge rate control circuits that have controlled gate voltages to therefore control output voltage slew rates.

BACKGROUND

In order to maintain performance in various amplifiers, such as a "Class D" switching amplifiers, the overall delay and dead time in the output stage should be kept low. However, this requires a fast turn on and off of the output field effect transistors (FETs). Turning these devices on and off quickly results in a very fast transition at the output of the amplifier, which can be problematic where electromagnetic interference (EMI) emissions are a concern.

FIG. 1A and FIG. 1B illustrate two conditions of sourcing or sinking a current. A load element is represented by current source 110. In FIG. 1A and FIG. 1B, current entering is controlled by MOS 130, and current coming out is controlled by MOS 120. With low side recycle, the edge will mostly be controlled by the high side device (MOS 120) except for phase shifted loads. A non-phase shifted load is where the current is directly proportional to the voltage across it. This is the case for resistors. Phase shifted load will have inductance of capacitance effect where the current lags or lead the voltage in time.

However, reducing the output transition, i.e. "unsharpening the edges" typically means weakening the gate drive strength; reducing the turn off and on time results in performance degradation. Moreover, there is a distortion issue.

Therefore, it would be useful to reduce the output transition time of amplifier drivers, while maintaining performance.

SUMMARY

A first aspect provides an apparatus, comprising: a load; an output FET having a drain coupled to the load; a first and second of a pair strong FETs, wherein a) a source of the first of the pair of the strong FETs is coupled to the load; b) a drain of the first the pair of the strong FETs is coupled to the source of the second of the of the pair of the strong FETs; the drain of the second pair of the strong FETs is coupled to a gate of the output FET; and a fixed current mirror is coupled to the gate of the first of the pair of the strong FETs.

A second aspect provides a load; an output FET having a drain coupled to the load; a first and second of a pair strong FETs, wherein a) a drain of the first of the pair of the strong FETs is coupled to the output FET; b) a source of the first the pair of the strong FETs is coupled to the drain of the second of the of the pair of the strong FETs; the source of the second of the second pair of the strong FETs is coupled to the load; and a fixed current mirror is coupled to the gate of the second of the pair of the strong FETs.

A third aspect provides an apparatus, comprising: a load; an output FET having a drain coupled to the load; a first and second of a first pair strong FETs, wherein a) a source of the first of the first pair of the strong FETs is coupled to the load; b) a drain of the first of the first pair of the strong FETs is coupled to the source of the second of the of the pair of the strong FETs; the source of the second FET of the first pair of the strong FETs is coupled to a gate of the output FET; and a first fixed current mirror is coupled to the gate of the first of the first pair of the strong FETs; a first and second of a second pair strong FETs, wherein a) a drain of the first of the second pair of the strong FETs is coupled to the output FET; b) a source of the first of the second pair of the strong FETs is coupled to the drain of the second of the of the second pair of the strong FETs; the source of the second of the second pair of the strong FETs is coupled to the load; and wherein the drain of the second of the pair strong FETs are shorted together with a drain of the output FET.

BRIEF DESCRIPTION OF THE DRAWINGS

Reference is now made to the following descriptions:

FIG. 3Bi and FIG. 3Bii illustrate various drawbacks that can occur with wave shaping of gate voltages;

FIG. 4C illustrates a graph of output voltage, input current to the FET driver, and input voltage to the FET driver;

FIG. 7C illustrates a gate source voltage for the LSD of FIG. 7B;

FIGS. 11A-11C illustrate a low side driver with a low to high transition and corresponding waveforms;

FIG. 16A-16C illustrates is a high side topology wherein the output is at the drain of a HSD NMOS and its associated transitions and waveforms;

FIGS. 18A-18C illustrates a high side driver and their associated waveforms;

FIGS. 19A-19C illustrate a HDS driver technology that is for a high to low transition that also uses capacitive feedback and its associated waveforms;

FIG. 22C waveform from 22A and 22B;

FIG. 24 extracts the slope of FIG. 23, including hand calculation vs. simulation;

FIG. 25A represent a prior art slowing down of voltage transition that create an unnecessary delay as recognized by the current inventor, thereby leading to the undesired distortion;

FIG. 25. B is a comparison between the prior art and the current application of FIG. 1B:

FIG. 25C is simulation results that corresponds to FIG. 25B;

FIGS. 27A and 27B illustrates the interconnections of the various FIGS. of the present application for an edge rate controlled driver.

DETAILED DESCRIPTION

Figure 2:
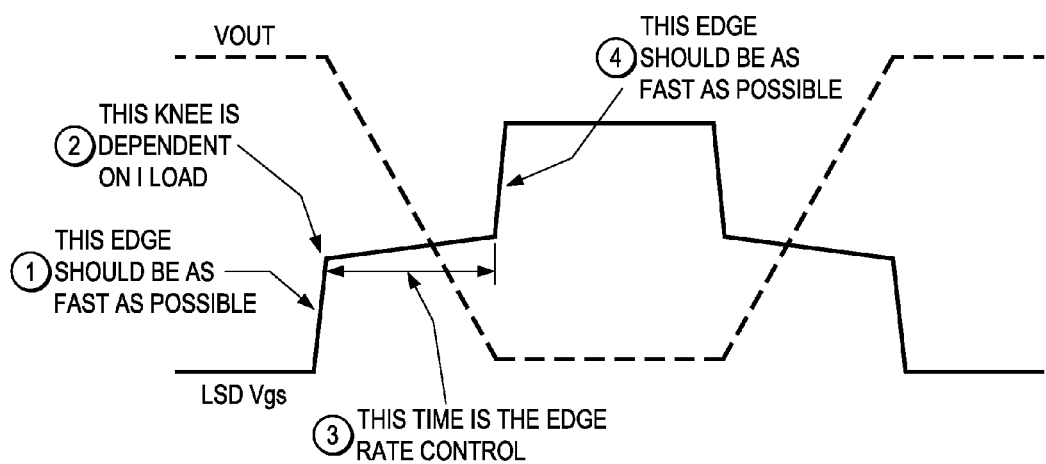
FIG. 2 illustrates an ideal transition of a driver for a low side gate voltage and output.

Turning to FIG. 2, illustrated is of an ideal transition of a driver input and output for a low side driver as understood by the inventor of the present application.

As is illustrated, the Vgs (the voltage between gate and source of the FET) should have a rise time as fast as possible at (1), as Vgs needs to be hit as quickly as possible for Vt. Then, at (2), the point of the knee of the input Vt, after which a much slower rate of Vgs voltage gain is applied, as determined by the load, as shall be described below, thereby leading to a much slower gain (3) of the output voltage. The increase of gate voltage is much slower here to reduce the output dv/dt (thus reduce EMI) and; (4) this part of the driver has a strong gain again in order to fully turn on the device and achieve minimum on resistance for efficiency, i.e. 100 ohms for a one watt amplifier. In one aspect, there is an RC product between the gate capacitance of the large transistor and the rdson of the driver that is in the order of magnitude of 10 nanoseconds in an audio amplifier.

Figure 2B:
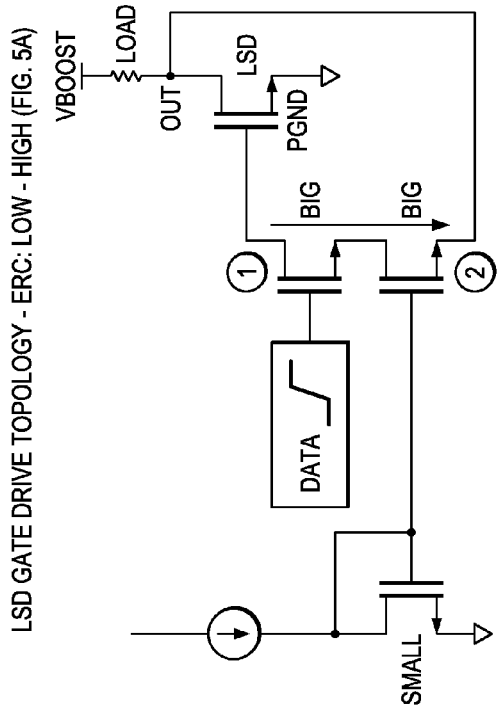
FIG. 2Bi-2Biii illustrates various individual wave-shaper circuits that are to be discussed in the present application and substantially incorporated into the system 2400 of FIGS. 27A and 27B.
Figure 2B:
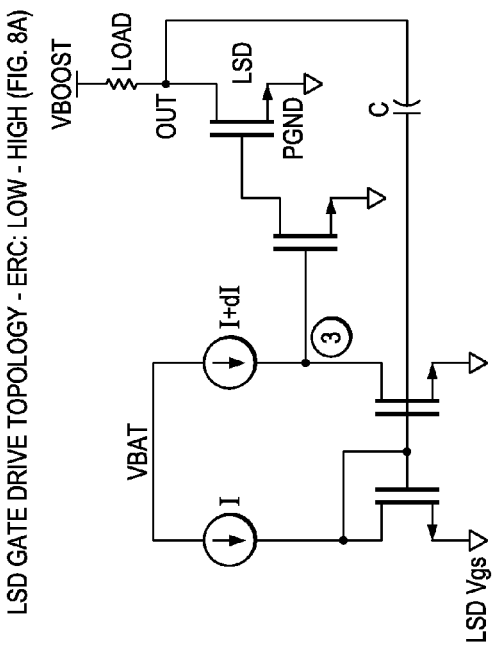
Figure 2B:
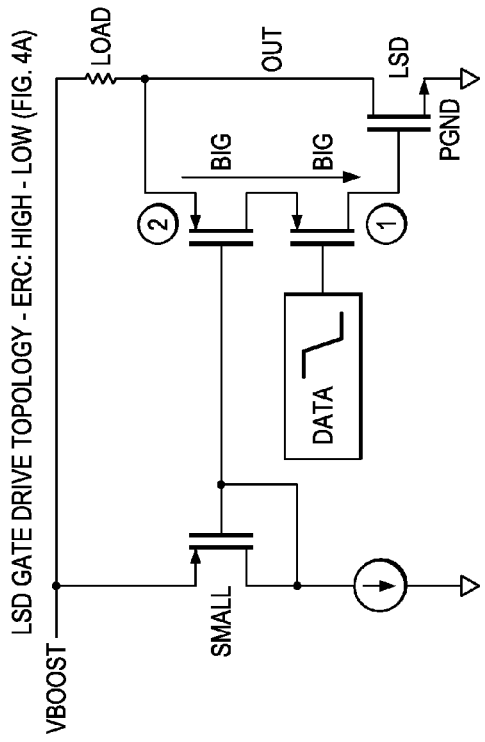
Figure 2B:
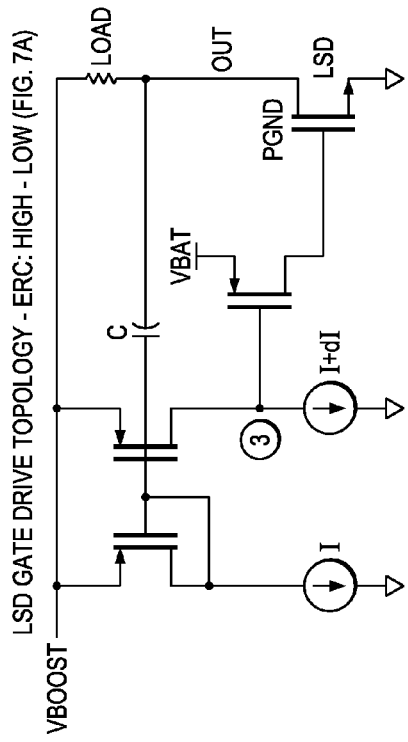

FIG. 2Bi-FIG. 2Biii illustrate various circuits that will be explained in more detail throughout this application that are used to drive various aspects of a driver circuit to help ensure than various drivers to the gate of edge transitions are illustrated. These will be described in more detail in FIGS. 4A-26C, below.

FIGS. 3Bi and 3Bii illustrate examples of what can happen if the transitions are not properly made in driver circuits.

In FIG. 3Bi, it is illustrated a result of the initial gate time rise is too slow, as Vgs needs to hit a threshold in order to turn on. If Vgs does not hit that threshold until later, there is a delay, which is not good for THD. This can be caused by undercharging, or if the initial "pull up" FET is too weak.

In FIG. 3B ii, it is illustrated how if Vgs is driven too high past Vt, $V_{out}$ snaps down, which ruins a slow edge.

As can be understood, either of these are problems. These problems also are propagated on the low side transitions, each with its own design criteria.

In the present disclosure, generally, a gate of an output FET is charged in three stages, where the delay and dead time can be kept low while an output transition can be controlled. The First and third stages are charged quickly when the output is not making a transition, and the gate is controlled slowly in the second stage while the output is making its transition. During the first and last segment, the gate charging does not control the output transition and these can be kept strong and fast to maintain performance. During the middle segment, the charging time can be controlled and weak in order to slow down the output transition time.

Figure 4A:
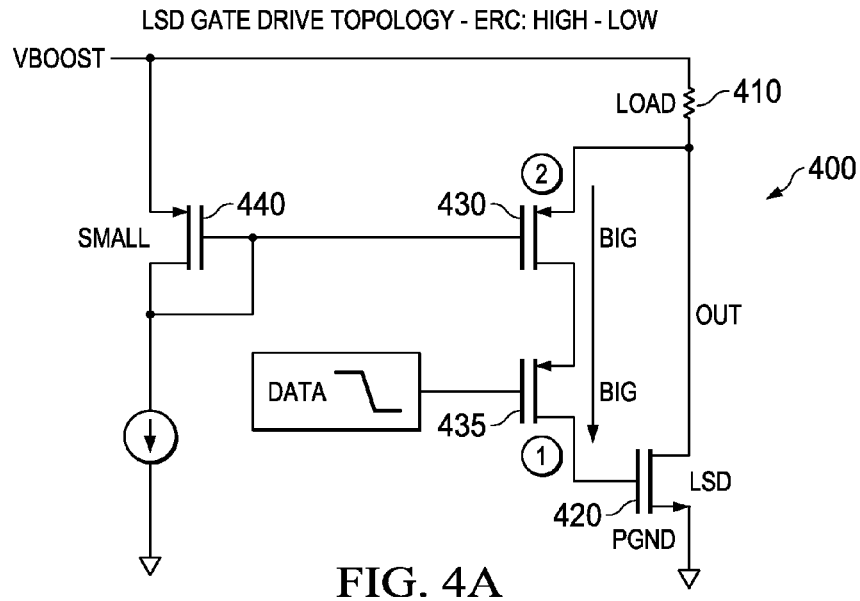
FIG. 4A illustrates a circuit for driving an input voltage on a gate for a LSD on a high to low transition.
Figure 4B:
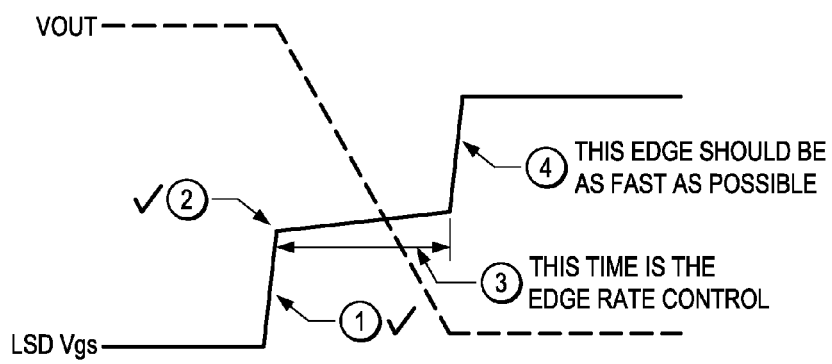
FIG. 4B illustrates its corresponding waveform.

FIG. 4A illustrates a low side driver (LSD) topology 400. A illustrated, the edge rate transition is from high to low. A load 410 is coupled to an output FET 420 having a drain coupled to the load 410, and FIG. 4B the corresponding transitions.

The LSD topology 400 further includes a first and second of a pair strong FETs (PFETs) 430, 435 wherein a source of the first FET 430 of the pair of the strong FETs (PFETs) is coupled to the load FET (NFET) 420; b) a drain of the first FET 430 the pair of the strong FETs is coupled to the source of the second FET 435 of the of the pair of the strong FETs. The drain of the second FET 435 of the strong FETs is coupled to a gate of the output FET 420; and a fixed current mirror 440 is coupled to the gate of the first of the pair of the strong FETs.

The addition of the mirror provides a cut-off path, a way of cutting off the transition. The voltage of the current mirror represents and is at a fixed bias potential.

The circuit 400 can work as follows. Assume that that driver data is transitioning from High to Low. In order to turn on a PMOS device, the source has to be higher than the gate. Therefore, the gate of FET 435 goes low, and FET 435 starts current conduction, which goes into the gate of driver FET 420, which creates a voltage knee 1) as discussed above. However, then the driver side FET 435 should also be cut off just the right moment, which is very close to the Vt threshold value for driver FET 420.

The current mirror therefore creates a fixed point in relationship to the supply (VBOOST). As the output device transitions down, that pushes the source of FET 430 down. Therefore, as the output voltage transitions down, the source of FET 430, therefore the Vgs of FET 430 is decreasing, and when Vgs is gone, the current path charging the gate of the LSD device FET 420 is completely cut. This ends the turn on transition of the LSD (420) at just the right moment. The source node should be biased very close to the supply. FET 430 is a large device and has very little Vgs to begin with, (Vgs-Vt) is near zero, i.e. near sub-threshold) so it is biased very close to its threshold voltage, so just a small transition on the output voltage will turn it off.

In one aspect the switch is on with a 435, 435 each have their own resistance, and the are charging the gate capacitance of LSD 420, so what we are looking for is a TC time constant that is on, for example. 10 nanoseconds for an audio amplifier.

Generally, the circuit 400 applies the initial "snap" to turning on an LSD output circuit from a high to low transition (1), and then applying the second "snap" to stop the continuous rise (2).

Figure 27B:
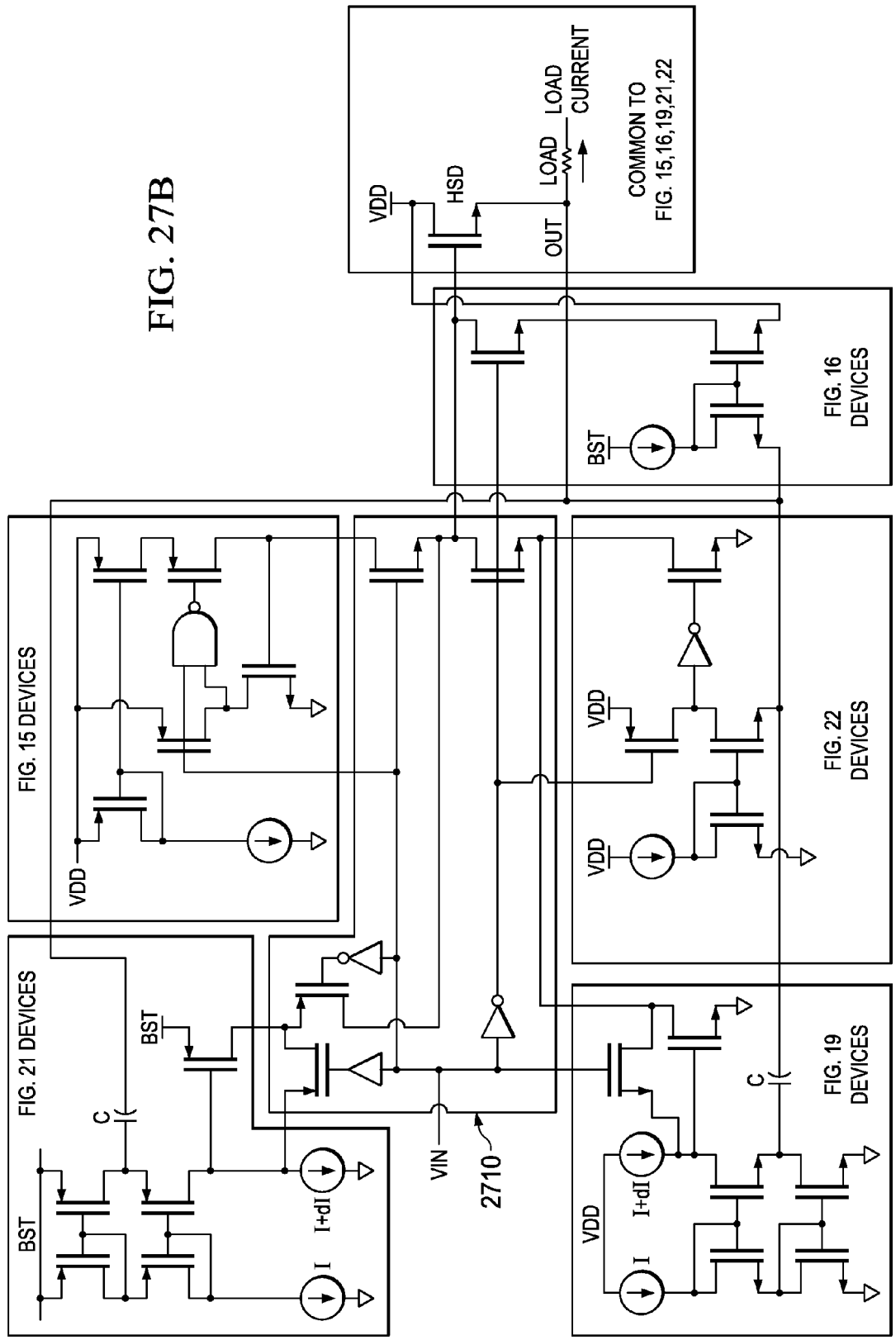

Please note that these various circuits are variously attached to a "master circuit" for driving a load, as is illustrated in FIGS. 27A-27B.

FIG. 4C illustrates various waveforms of the LSD topology for edge rate control, wherein the input values are transitioning from low to high.

Figure 5A:
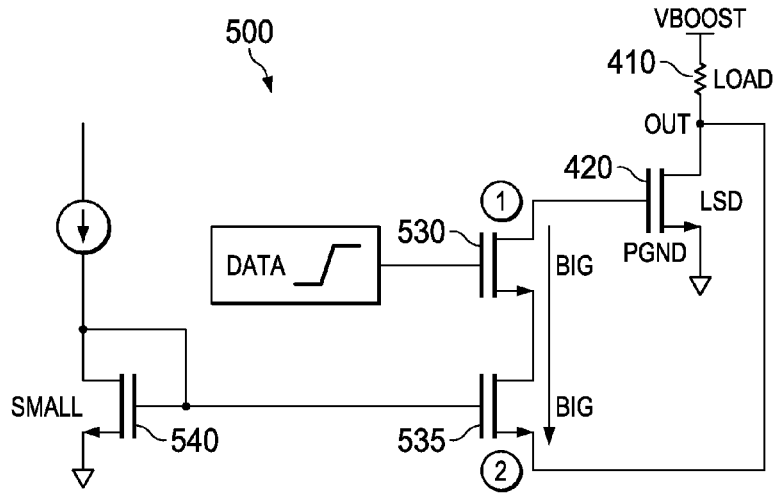
FIG. 5A illustrates a circuit for driving an input voltage on a gate for a LSD on a low to high transition.
Figure 5B:
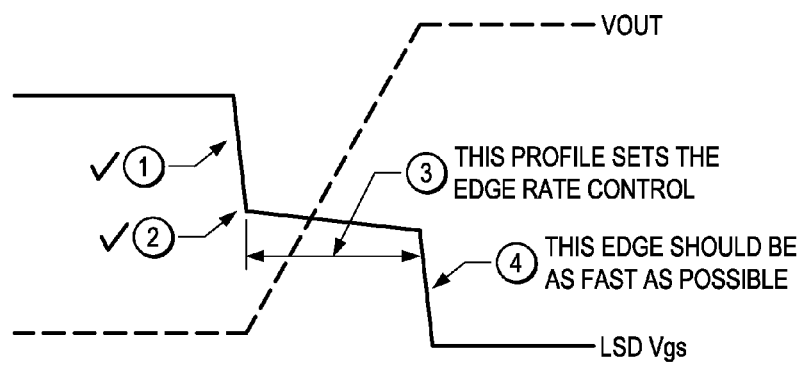
FIG. 5B illustrates its corresponding waveform.

FIG. 5A illustrates a low to high output transition circuit 500 for a low side driver. The output FET 420 has a drain coupled to the load. The circuit 500 further includes a first and second of a pair strong FETs 530, 535, wherein a) a drain of the first FET 530 of the pair of the strong FETs is coupled to the gate of the output FET 420; b) a source of the first FET 530 the pair of the strong FETs is coupled to the drain of the second FET 535 of the of the pair of the strong FETs; the source of the second FET 535 pair of the strong FETs is coupled to the load 420; and a fixed current mirror 540 is coupled to the gate of the second FET 535 of the pair of the strong FETs.

Generally, the circuit 500 provides a fast discharging path for an initial gate discharge. The source switched NMOS current mirror 540 cuts off once Vout begins to move. Since the current mirror 535 senses Vout directly, the cut off point for the fast discharge path in not at a fixed Vgs for the LSD. This makes the source switched NMOS mirror independent of the load current.

Here, the data comes into large NFET 530, thereby turning on FET 530, which discharges FET 420. Therefore, as the gate of 420 discharges the output voltage will increase decreasing the Vgs of 535 since the gate of FET 535 is fixed due to the current mirror 540. This turns off the discharge path for FET 420 at precisely the right moment.

Generally, the circuit 500 applies the initial "snap" to turning off an output circuit from a high to low transition (1), and then applying the second "snap" to stop the continuous rise (2).

Figure 5C:
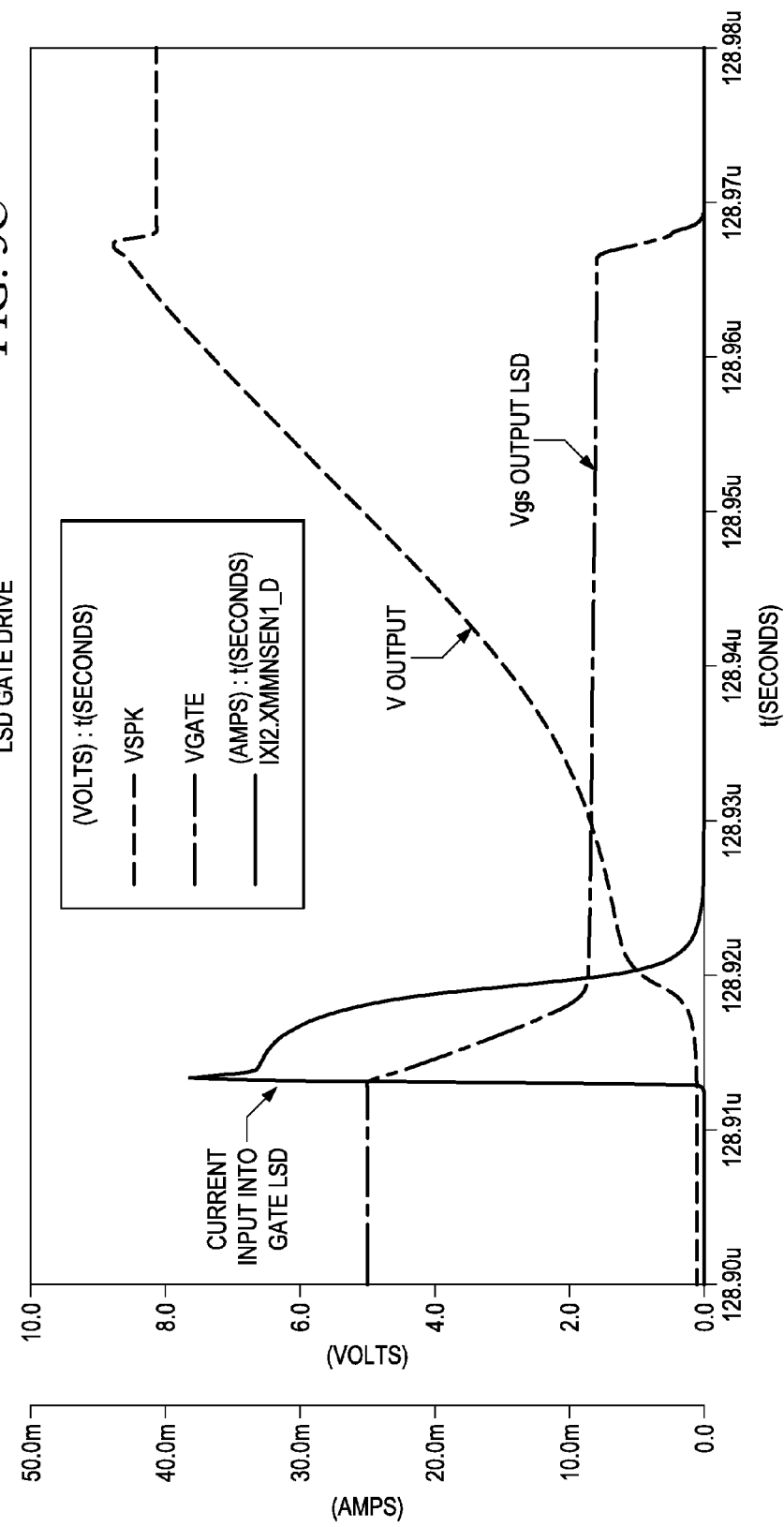
FIG. 5C illustrates a graph of output voltage, input current to the FET driver, and input voltage to the FET driver.

Turning to FIG. 5C, illustrates various waveforms of the LSD topology for edge rate control, wherein the input values are transitioning from low to high.

Figure 6:
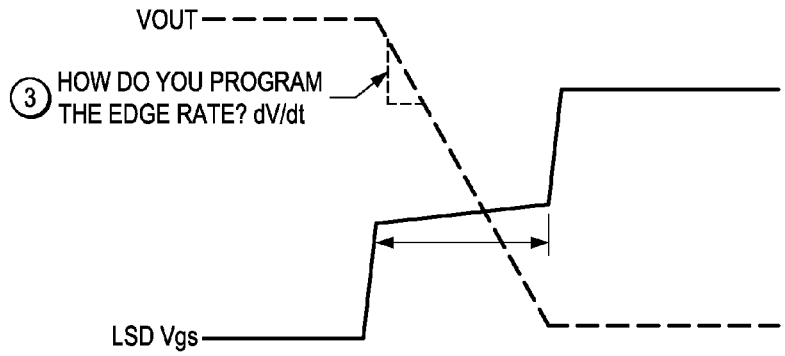
FIG. 6 illustrates transition risks.

FIG. 6 illustrates transition risks. Here, it is asked how does one select and program the edge rate of voltage dV/dt. The edge rate needs to be selectable and controlled over process, voltage, temperature. MOS switch impedance is very dependent upon PVT. There is also an high non-linear relation between a straight output transition and the MOS Vgs.

Figure 7A:
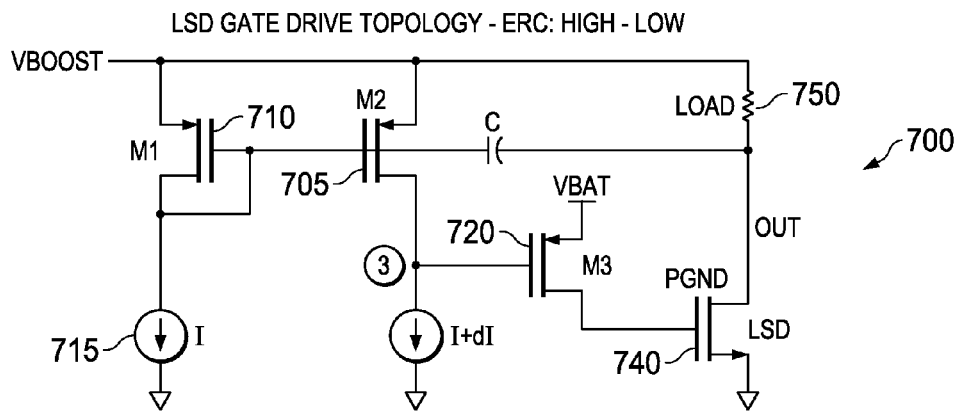
FIGS. 7A and 7B illustrate a circuit for driving an input voltage on a gate for a LSD on a high to low transition.
Figure 7B:
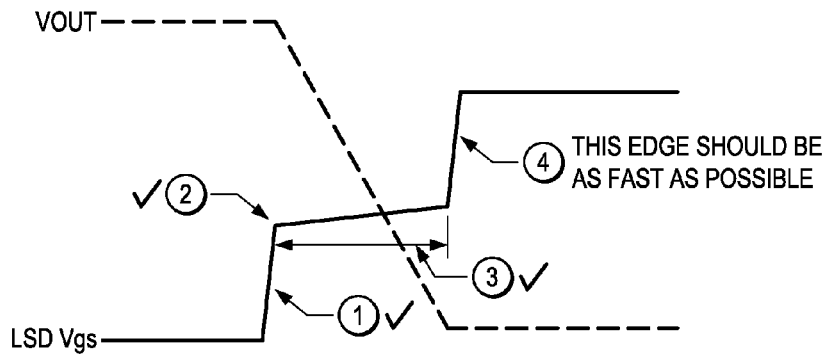

FIG. 7A and FIG. 7B illustrate a LSD Gate Drive Topology 70 from a high transition to a low transition at knee 3 and a circuit to implement that transition. The present inventor recognized that, because there is a linear input into a nonlinear stage in the prior art, one really needs a nonlinear charging current to drive the LSD NMOS 740 device.

Generally, in the prior art Vgs of a low side driver was assigned to an arbitrary fixed value and the characteristics change according to the value of the capacitance and the voltage used to drive the low side driver to bring it up to a given value quickly. But, once the proper value of voltage is achieved, it is desired to continue charging this low side device in a low, controlled fashion. So what was typically done in the past is that one just arbitrary pick some size to charge it with say, 2 mA. Here, the parasitic gate capacitance was being charged so there is a slow steady increase of gate voltage.

What is typically done before is just a fixed bias current that gives us approximately have a fixed bias current though to do the fast charging, this will create a distortion problem once it is desired to do slow charging.

Therefore, in the prior art, the edge control was broken into two separate charging schemes in order to avoid the threshold problem. However, even if the first two points correct, the turn off point and the turn on point, and now working on point number three of FIG. 7B, the gate voltage here, relative to the output, is still very non-linear (nonlinear gain stage. This is unacceptable.

The circuit 700 includes a capacitive feedback element 705. A PMOS current mirror 710 is coupled to vboost, wherein the current mirror includes a current source 1715 coupled to a drain of current mirror M1 710 and I+dI 720 coupled to a drain of a current mirror 720. The gate of a PMOS M3 is coupled to the current source 720 and a drain of the PMOST M2 at a node 3 of the circuit 700. A source of the PFET M3 is coupled to a battery, and the source is coupled to a gate of an PNMOS 740. The source of PMOS 740 is coupled to ground, and the drain is coupled to a load 750 and the capacitive element 705.

Generally, in order to linearize the circuit 700, feedback is employed, wherein the capacitor for feedback. A capacitor is a linear element. And it has a characteristic of . . . I=c dv/dt. So, it acts as a differentiator of voltage. Therefore, if a constant differential is taken of voltage a constant current is generated. The constant of a differential of a slope of a straight line is a constant. Therefore, after selecting this ideal voltage, and a constant current out will be generated. The circuit 700 takes that constant current that was derived from a voltage change on the load, and injects it against a reference current The circuit 700 includes a current mirror 710, and transistor M1 and transistor M2. So, M1 is biased with I. M1 and M2 are the same size. So M2 also wants to flow I, as it is a current mirror. But, the drain of M2 sees the pull-down current of some I plus delta I. from current drain 720, a fixed current source. Without the feedback effect of capacitor 705, so M2 will flow, with no other point of injection into M1, so M2 pulls down node 3, because the current source larger than the pullup current of M3/M2.

Once pulld-own occurs to a low-voltage point at node 3, M3 turns on because its gate goes low. Once M3 turns on, the lowside device PFET 740 begins to charge so the output begins to go low. Therefore, the faster M3, the faster the output goes low at LSD NMOS 740

The above analysis has been performed without taking into account of the capacitor 710. However, if the feedback characteristics of the capacitor 710 are included, once the output begins to transition low at NMOS 740, then that dv/dt times this capacitance value injects an Ic into M1. M1 is flowing I plus whatever current is flowing through $I_c$ 710. Therefore, what M1 flows is I plus Ic (I+C dv/dt).

So now M1 flows I+Ic. If C dv/dt, as measured at the load 750, is greater than I plus delta I, then M2 pulls M3 730 high at node 3 before M2 shuts off. Therefore, the low side device 730 is no longer charging up so the outside device MR 740 is no longer transitioning low. Therefore, the output is no longer transitioning low, so dv/dt goes away, which means the I+C dv/dt goes away from the, so it goes down to I, so M2 goes down to I as it tracks M2, therefore I+dI pulls that node 3 down. As node 3 goes down, that pulls down that low-side device 740, and inject dv/dt is controlled. In the negative feedback system of the circuit 700, it tends to naturally converge to the proper slope and linearize the output voltage.).

Advantageously, a designer or an end user of the circuit 700 does not have to know what this non-linear gate curve is of the LSD 740, instead, dv/dt is sensed by the capacitor 705 and put it in a feedback system, and the system 700 compensates. Because dI equals C dv/dt, the value of the capacitor 705 can be selected, which controls dv/dt.

In a further aspect, if it is desired for dv/dt to be faster or slower, the dI value is changed. Therefore, current source 720 can include a whole array of current switches here, just turn them on and off, which can be a digital to analog converter (DAC), and then if processing comes out and the value of capacitance is not within tolerance, and it is desired to trim dv/dt for a particular part, then some trim is added into dI, so it is a slower than is wanted to change the dI, that is the nice thing about it, just changing the dI makes it nice to control.

FIG. 7C illustrates vgs of the low side device, and vout, and otherwise known as a control PMOS M3, also referred to as a control PMOS, which corresponds to node 3. Vgs is a very non-linear curve, so if one had merely put a linear current source in here one may not have gotten a sufficient response time, as the response time is typically in the nanosecond time range. Generally, getting the circuits to respond near-instantaneously has a finite bandwidth to it has a near-instantaneous response, is showing the nonlinear element of what the control voltage is having to do, whereas if as in the prior art had a current source here at Vgs, this would be biased at a fixed voltage, which would increase the distortion of the final output.

Figure 8A:
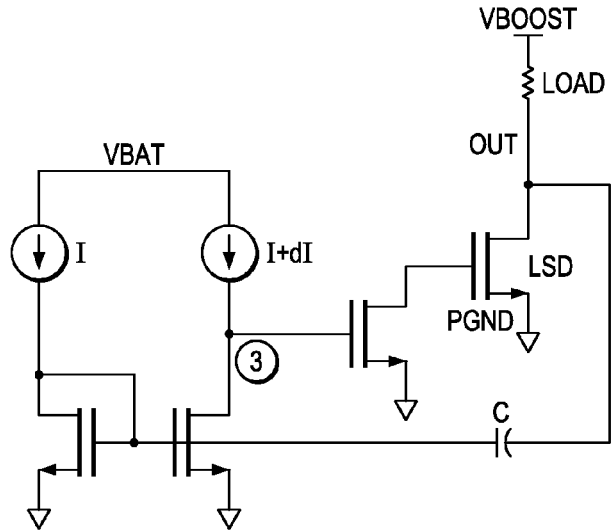
FIGS. 8A-8C illustrate a low side driver gate topology, from the transition of low to high, and is in some ways analogous to FIG. 7A-7C.
Figure 8B:
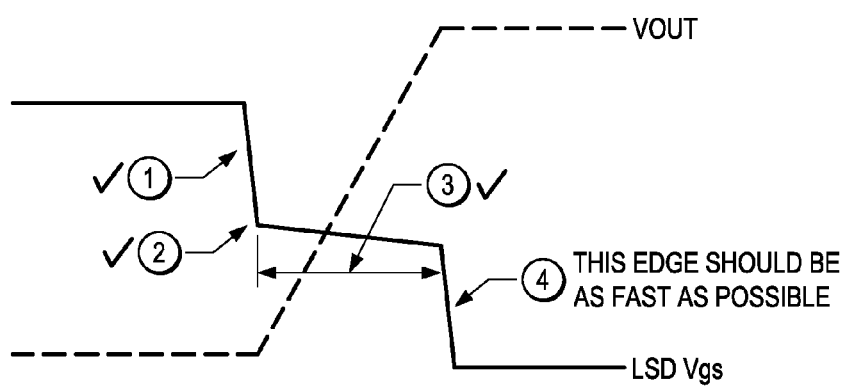
Figure 8C:
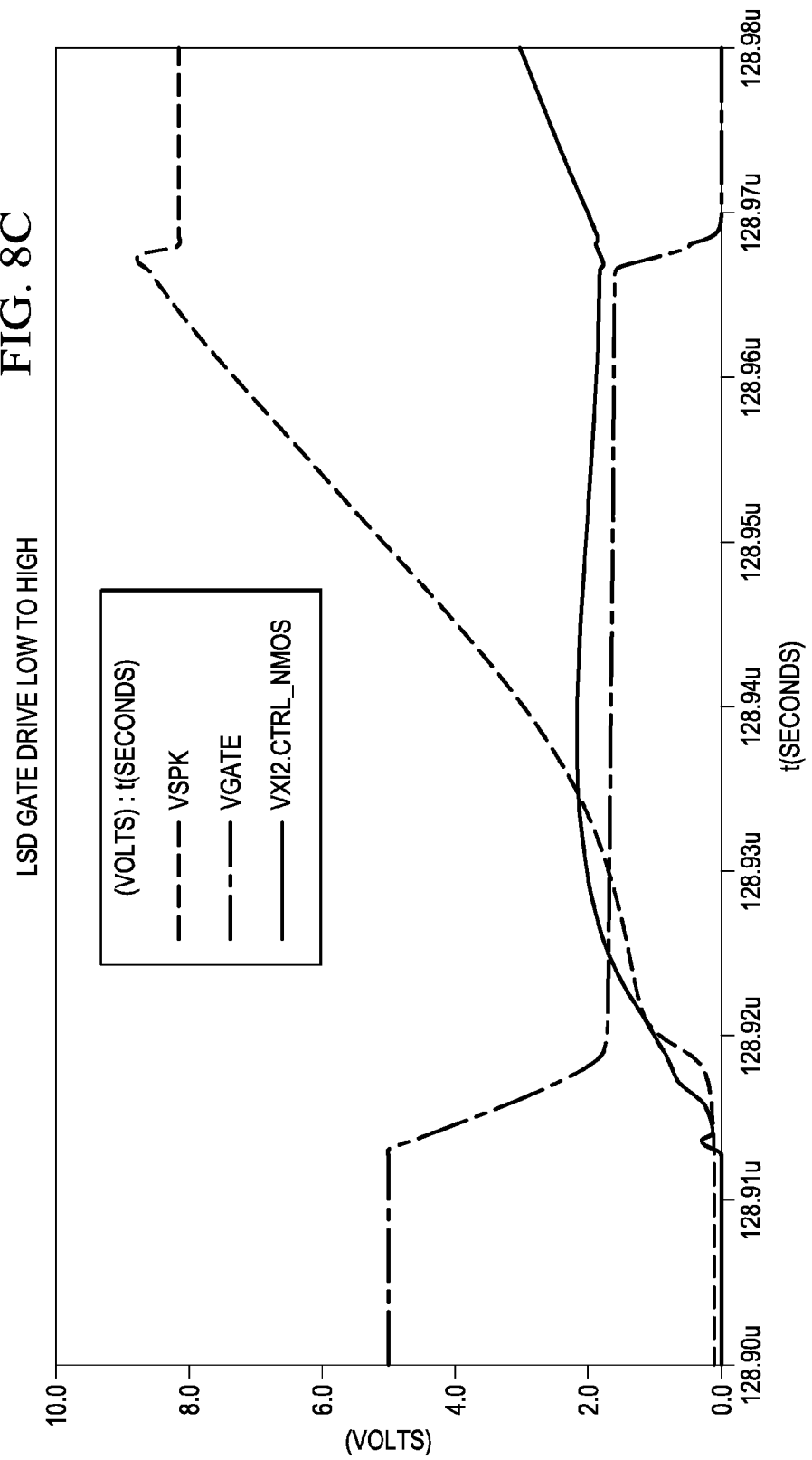

FIGS. 8A-8C illustrate a low side driver gate topology, from the transition of low to high, and is in some ways analogous to FIG. 7A-7C. So high to low to low to high basically the turn off or the turn on of the low to high side device.

Figure 9:
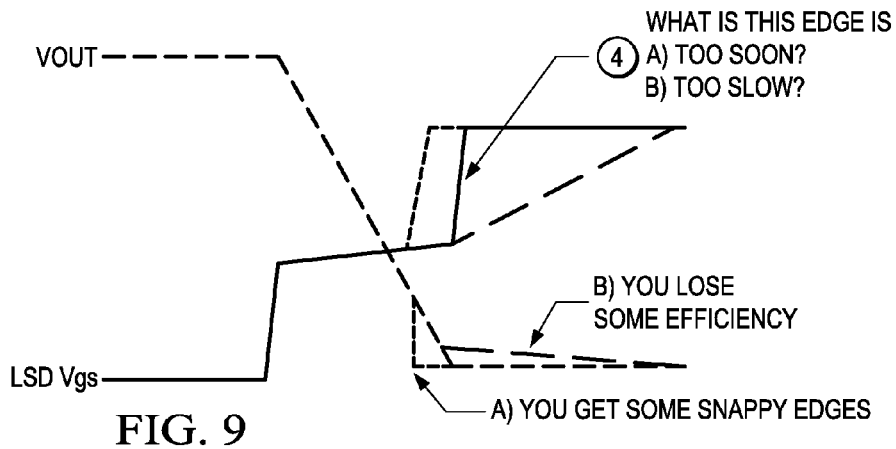
FIG. 9 illustrates transition risks.

FIG. 9 illustrates that, as understood by the inventor, once the output has made its final transition, at some point in time it is desired to say that the output is finished, in other words it is desired to turn the output FET all the way or turn it off all of the way. However, from an efficiency standpoint, the output may be all the way down, but the $r_{ds}$ is not at its minimum, so efficiency in respect to class D/buck boost—prop to $r_{ds}$ on—the lower the $r_{dson}$, the lower the voltage drop across the switch, the lower the voltage drop across the switch for a given current the lower power it dissipates, which is less heat.

Figure 10A:
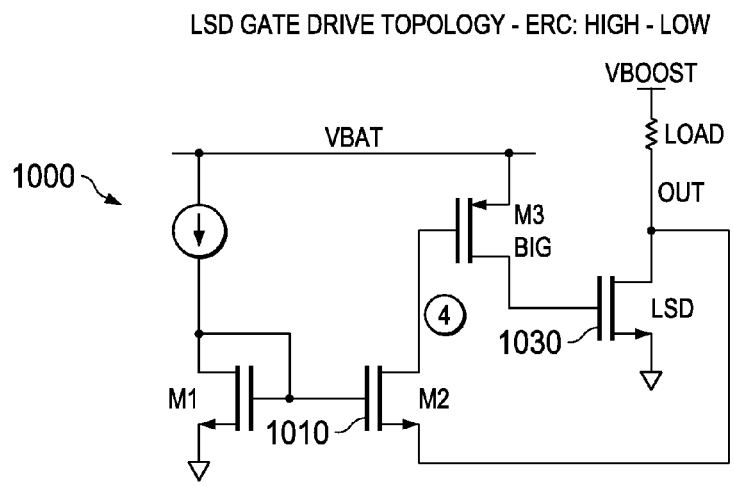
FIG. 10A illustrates a low side driver with a current mirror.
Figure 10B:
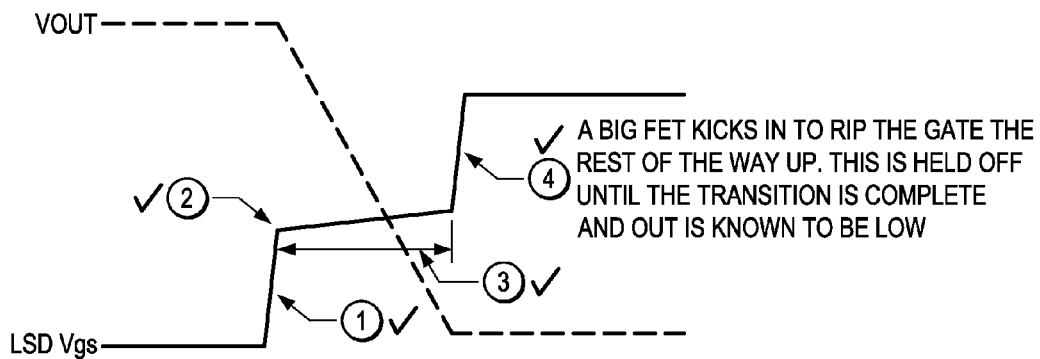
FIG. 10B illustrates a transition of FIG. 10A.
Figure 10C:
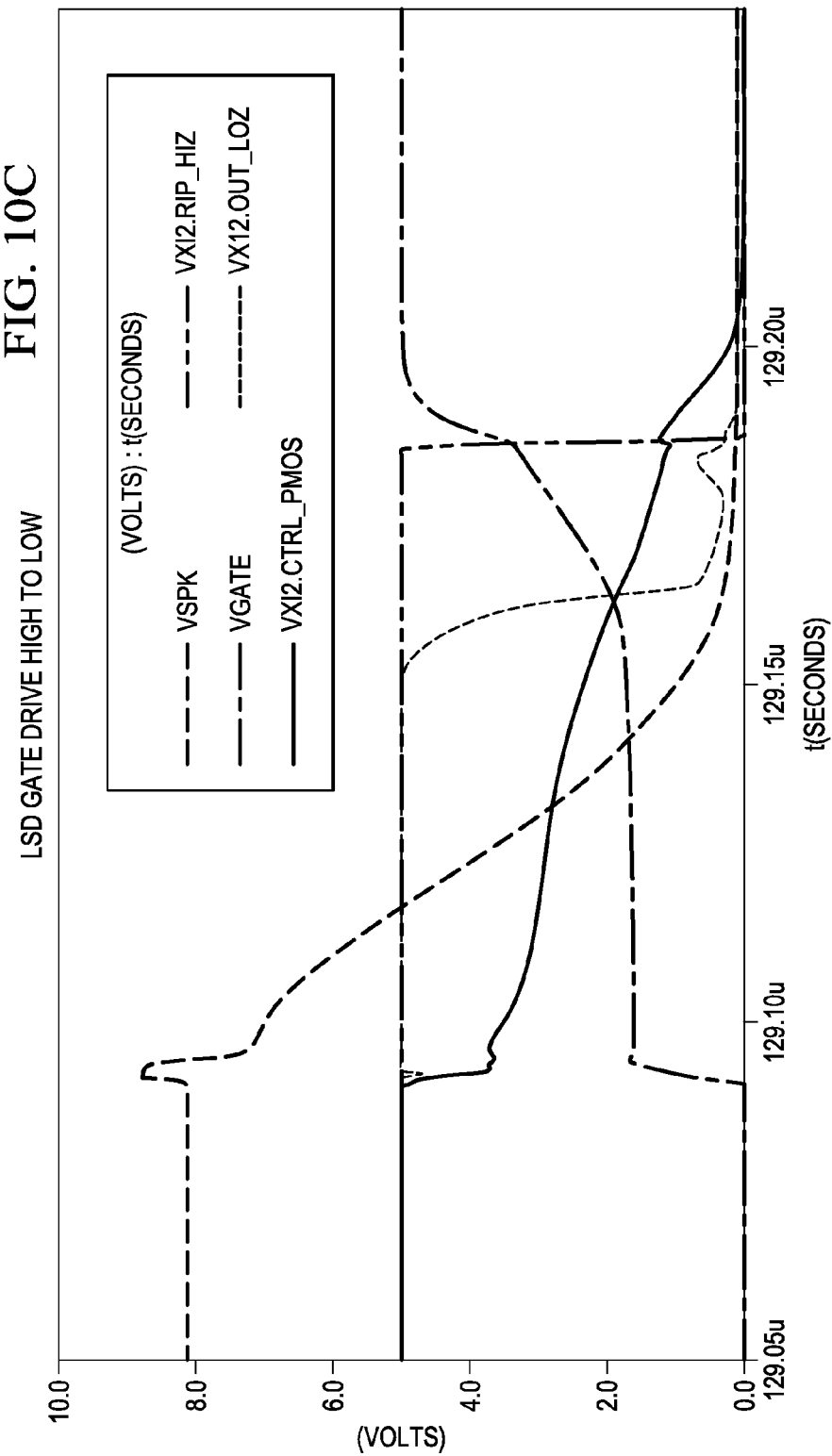
FIG. 10C illustrates a gate voltage transition of FIG. 10A.

FIG. 10A-10C illustrate a low side driver 1000 with a current mirror 1010 having a NMOS N1 and NMOS M2.

Regarding efficiency in respect to class D/buck boost, it is proportional to rds on—the lower the $rds_{on}$ the lower the voltage drop across the switch, the lower the voltage drop across the switch for a given current the lower power it dissipates, which is less heat.

In FIG. 10A, in a PMOS 1020, if a control PMOS is turned it on too soon, such as M#, EMI will be injected; this is not preferable, yet it is not desired to continue to let this turn on slowly. Therefore, the output is slow, so rather than with respect to supply it is with respect to ground.

So when the output of the circuit 1000 reaches ground, regarding FETs M1 and M2, if the output reaches ground, then M2 would flow the same current as M1 with M2 is being sourced switched. Therefore, once M2 starts flowing current, it only starts flowing when current reaches ground, or near ground, M2 flows current which turns on M3, and M3 flows current which turns on the low side device all of the way. Please note that M3 is sufficiently large that its RC product with the gate capacitance of LSD 1030 is in the 10 nanosecond range Turning to FIG. 10C, illustrated is a curve vout Vgs on the low side device. Here the output is transitioned. There is a little bit of a delay just because of the capacitance, and turns on all the way. This would have continued to go on all the way—get a little bit of efficiency, needed from a distortion perspective.

Figure 11A:
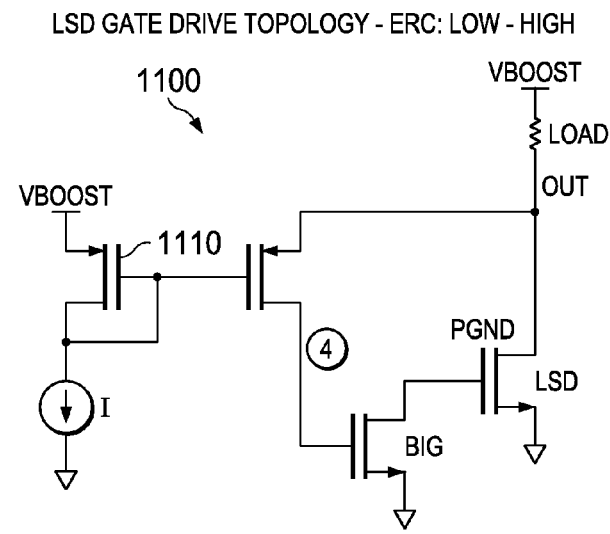
Figure 11B:
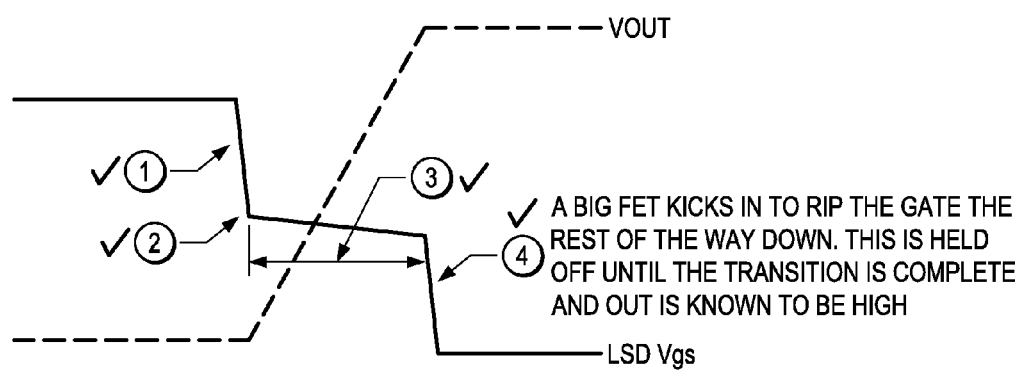

Turning briefly to FIG. 11A-11C, illustrated is a low side driver with a low to high transition which uses a PMOS current mirror with respect to reached the low point instead of high point.

Figure 12A:
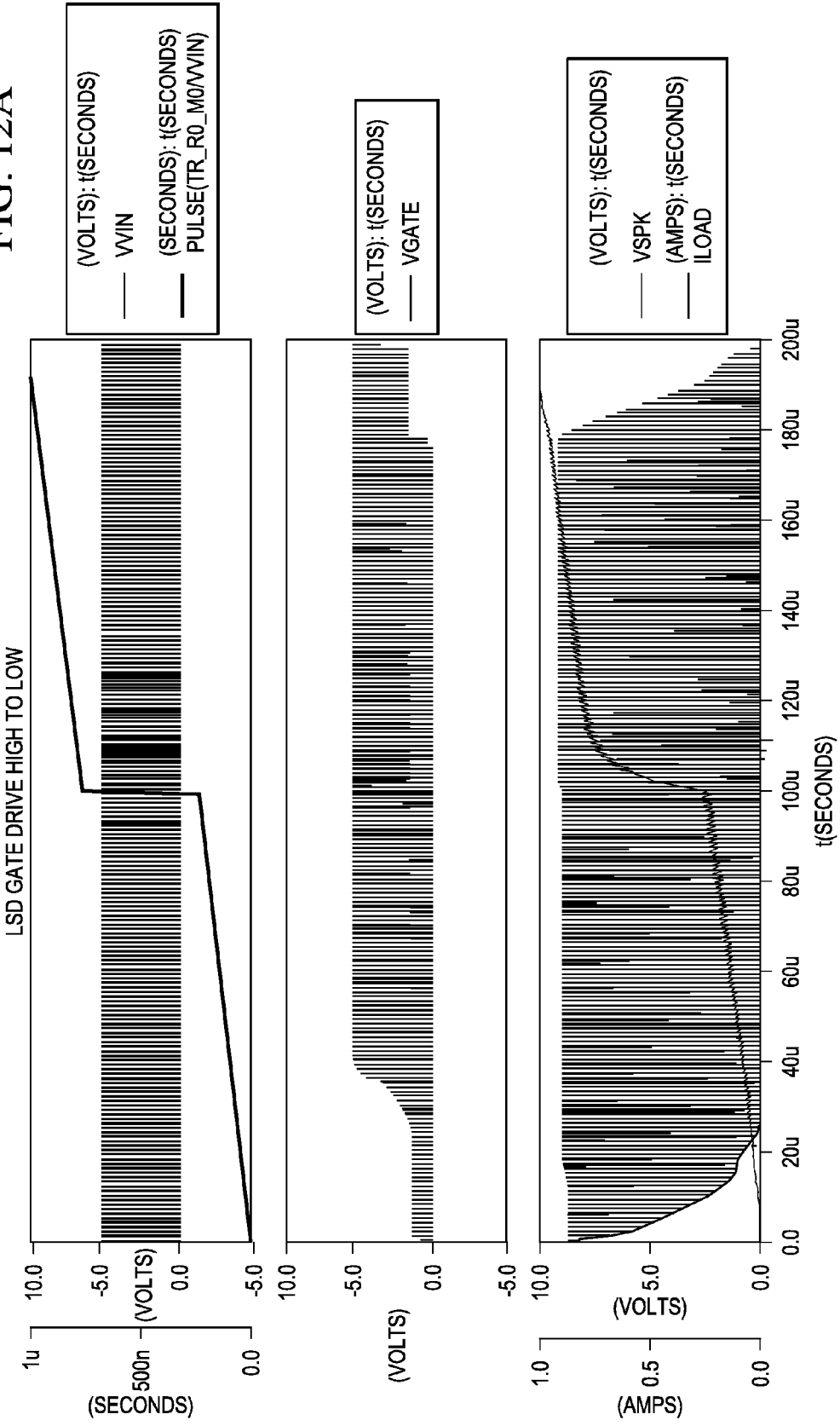
FIGS. 12A-12B illustrate a sweep of low current and then high current.
Figure 12B:
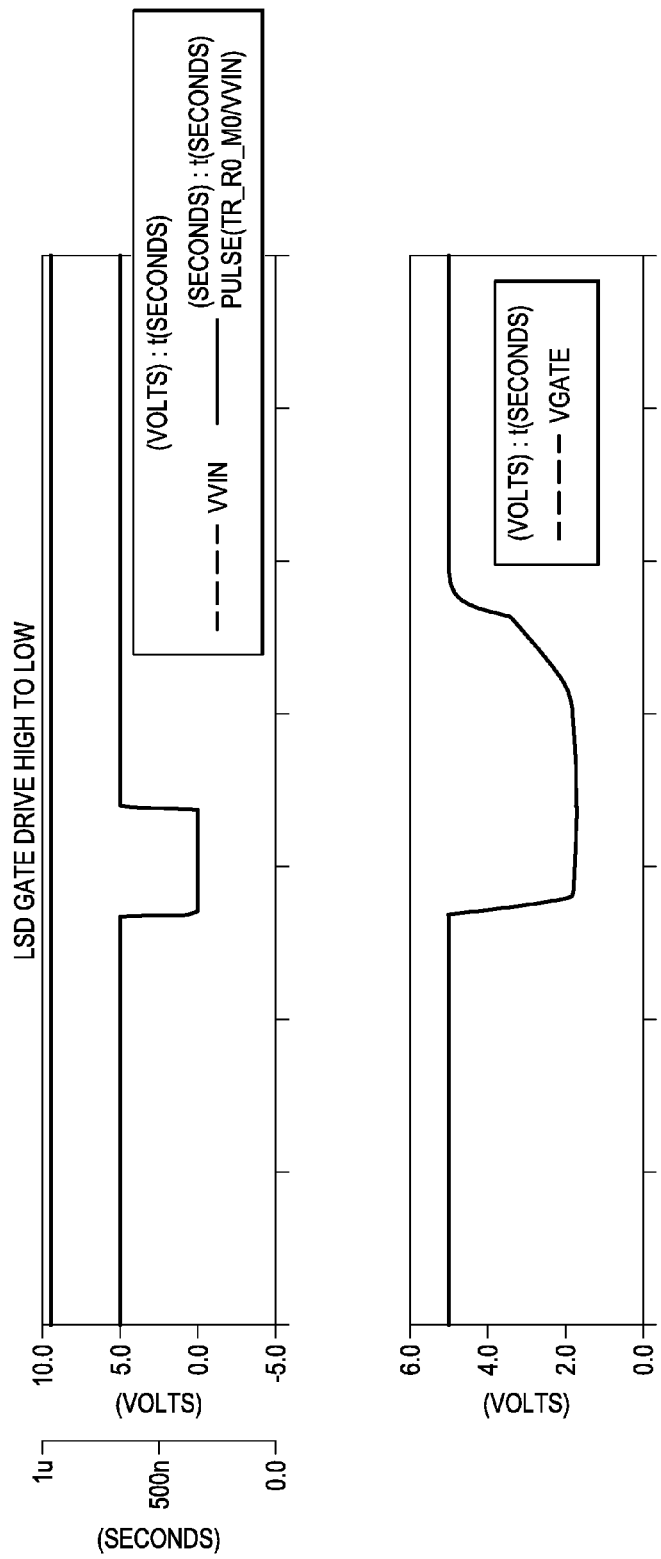
Figure 12B:
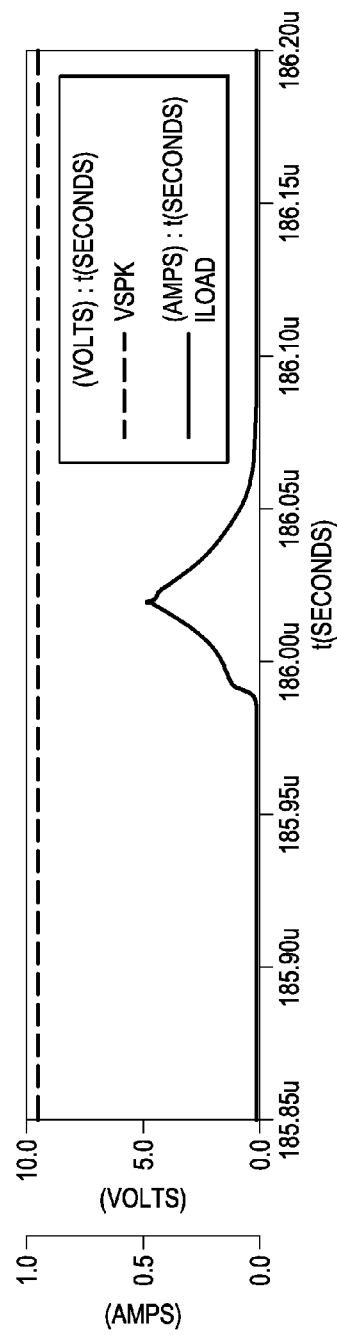
Figure 13:
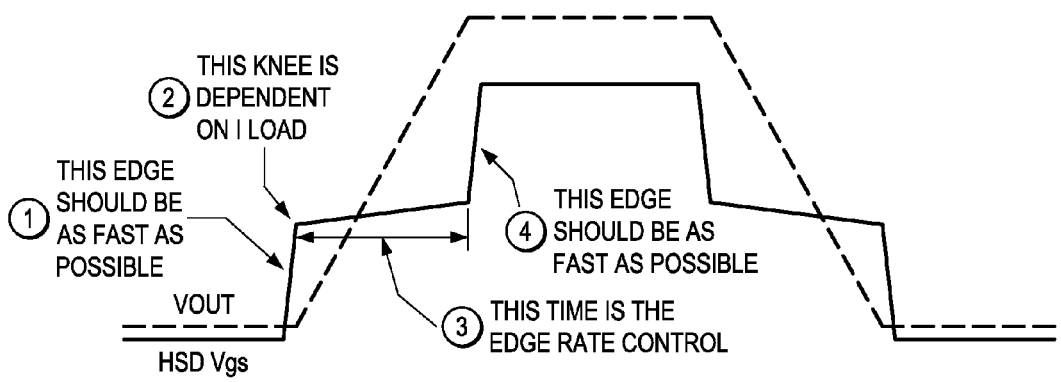
FIG. 13 illustrates ideal transitions for a high side driver.

Turning to FIGS. 12A-12B, illustrated is an the exchange of really low current and then high current As the pulse width is increased, so the current builds up scaled to a 1 Megaherz clock Turning to FIG. 13, illustrated are the ideal transitions for the high sigh driver.

Generally, one difference between a high side device and a low side device is that the low side driver, being NMOS, uses an inversion from the gate to the output, there is an inversion here, as the signal goes up, the gate goes down, whereas the high side device is a PMOS, then the gate drive circuit would be identical to each other, because the gate to output relationship would still maintain the same inversion.

Because an NMOS is employed as the high side device, the gate to output device is non-inverted, so it appears to be a follower, of the gain relationship and so because of that all of the same principles of the low side device applies to the high side device. However, the inversion is at least somewhat compensated for. This signal is the difference is the inverted of the PMOS and the and now in reality there is a non-overlap control circuitry to make sure that both of these devices are not on at the same time.

Figure 14A:
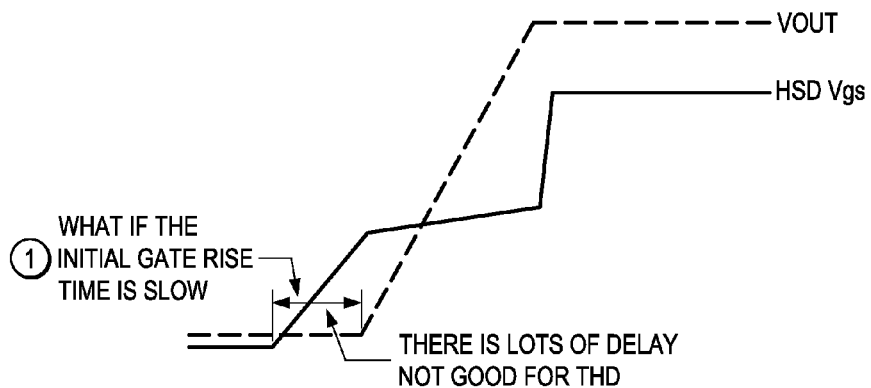
FIG. 14A-14B are transition risks for a HSD driver.
Figure 14B:
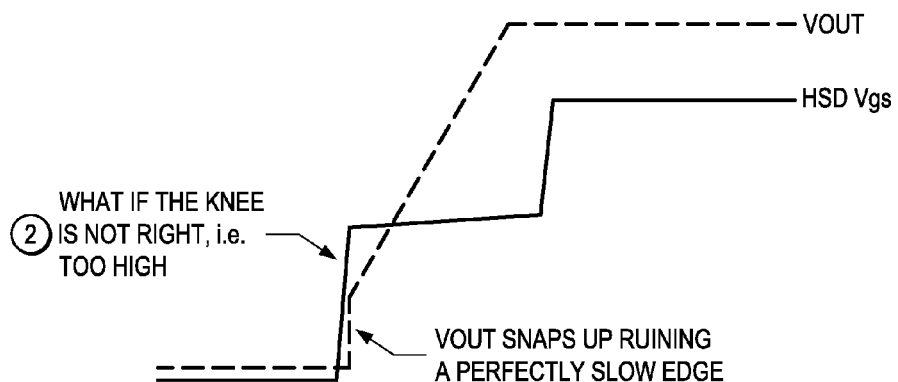

Turning to FIGS. 14A and 14B, illustrated are transition risks for a HSD driver.

Figure 15A:
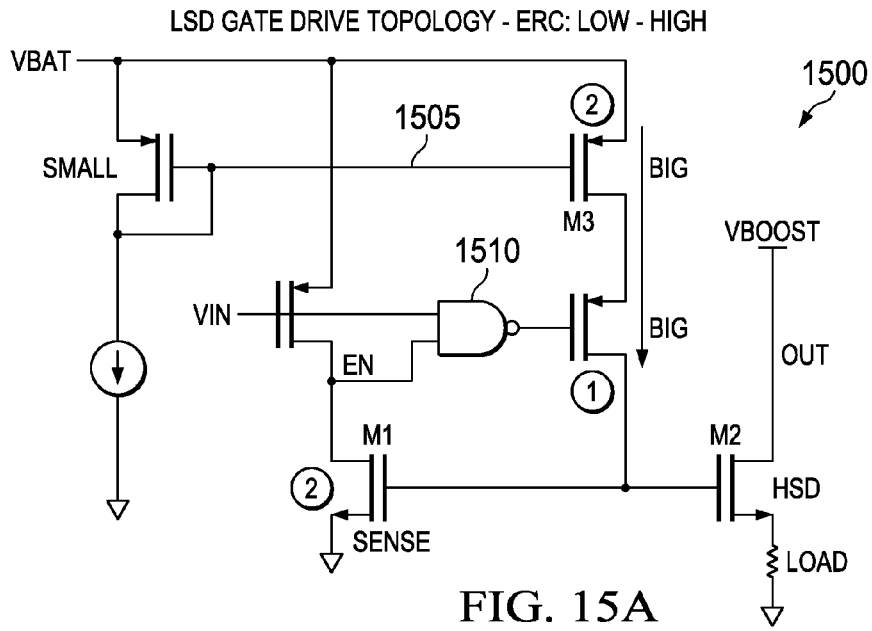
FIG. 15A-15C illustrates a high side driver.
Figure 15B:
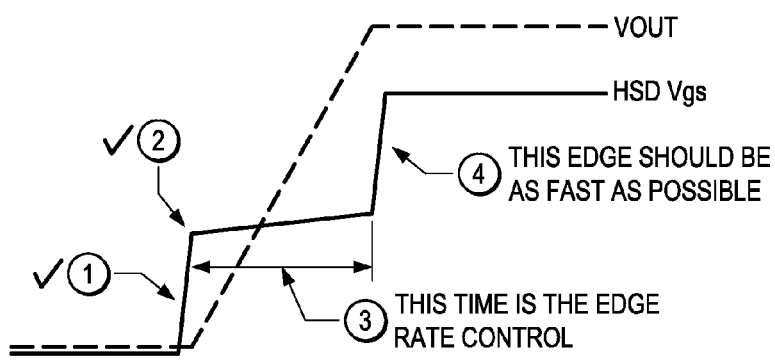
Figure 15C:
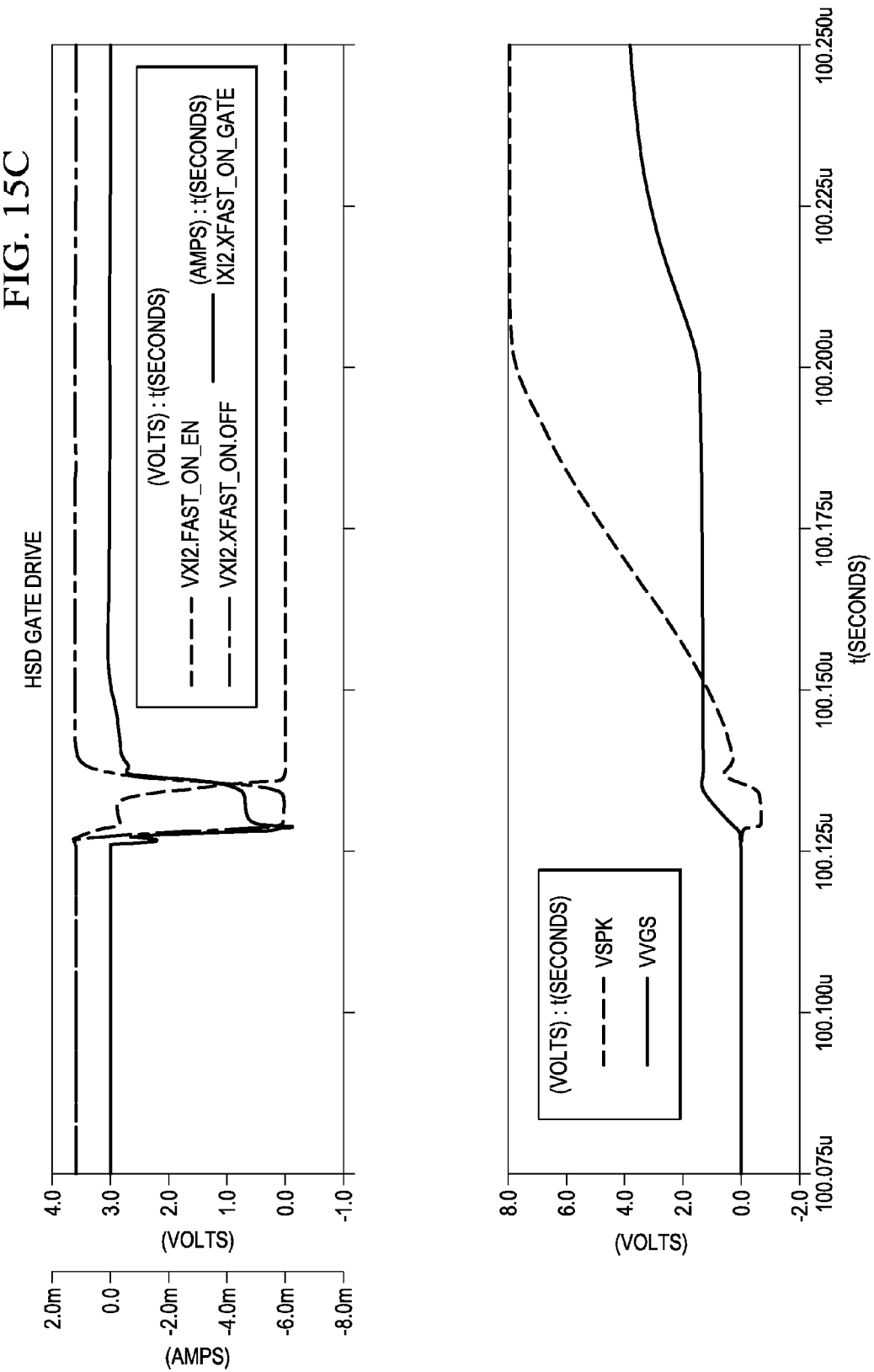

Turning to FIG. 15A, illustrated is a high side driver 1500. Because NMOS M2 is chosen as the high side device, the gate to output device is non-inverted, so it looks like a follower of the gain relationship and so because of that all of the same principles of the low side device applies to the high side device. However, the inversion is at least somewhat compensated for, and there is a non-overlap control circuitry to make sure that both of these devices are not on at the same time.

Generally, one difference between a high side device of FIG. 15A and a low side device FIG. 4A for this is that the low side device being NMOS uses an inversion from the gate to the output, there is an inversion here, as the signal goes up, the gate goes down, whereas the high side device is a PMOS, then the gate drive circuit would be substantially identical to each other, because the gate to output relationship would still maintain the same inversion As opposed to FIG. 4A, the LSD 1500 senses the output directly with its current mirror and it would cut off right at the right point as its output fell, because the high side device M2 of FIG. 15A is NMOS and is not inverting. However, because the circuit 1500 is trying to charge this up there is not a direct set point. So the set point is done a little differently.

A sensor device M1, the one that turns on the inrush current. As the gate of M2 begins to charge the output will eventually begin to follow the gate. Go high as the gate goes high, because it is known when the high side device begins to conduct current, as the current cannot conduct until the gate has at reached its threshold value for the NFET, the sensor device M1 is sensing the gate of the same device type so their Vts should match relatively speaking NAND 1510 takes the output of the M1 sense device and logically inserts it into the datapath.

Gate-coupled NFETs M1 and M2 should have the same characteristics. So when M1 reaches Vt, M2 reaches Vt. And it will start conducting current. So when M1 reaches Vt that is going to pull down this enable signal. Once enable goes low, this device is turned off. A current mirror 1505 is providing a constant current source. The constant current mirror source 1505 is switchable.

A reason to use a current source 1505 is this gate circuitry is running off a battery that fluctuates, as the battery voltage changes the strength of M3 changes, which means that the inrush current changes so a charging of the high side device changes, so the current source makes it a little bit more constant.

The circuit 1500 is sensing at M1; there is nothing that senses to Vout, instead, when M1 turns on at Vt, M2 turns on at Vt. If M1 has just turned on Vout cannot be really high as M2 just turned on, so they cannot have been conducting current prior to that. Therefore, the M2 is really stopping right of the threshold of the high side device. M2 is charged up, but M1 is turned off at the earliest point before it is a problem.

A downside of that is the knee could be at a higher or lower value—the circuit stops at the lowest value here to avoid the EMI problems from shooting up. With different load currents that should have been like that or that but because the circuit cannot sense the output in the same manner, in some aspects, the lowest point is picked.

Figure 16A:
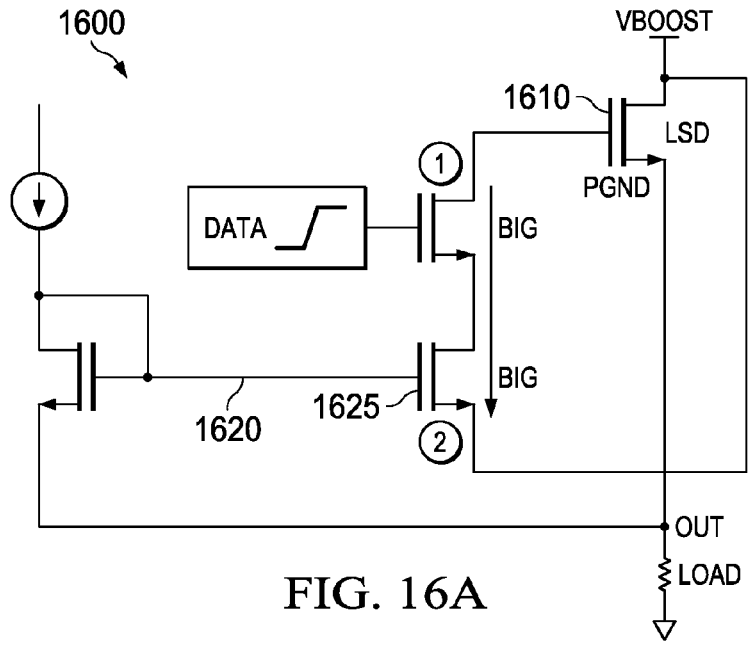
Figure 16B:
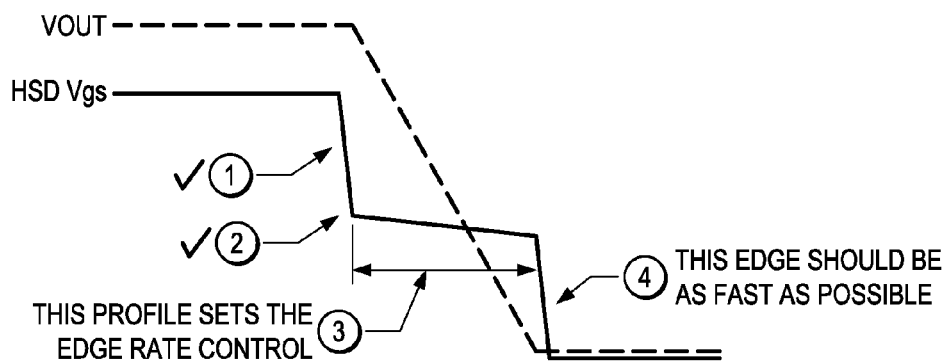

Turning to FIG. 16A-16C, illustrated is a high side topology 1600 wherein the output is at the drain of a HSD NMOS 1610 and its associated transitions and waveforms.

On the turn off case allows the same approach as before in the low side device of circuit 500, in that the circuit is able to sense the output voltage although the current mirror is connected differently.

Similar to the circuit 500, the circuit 1600 senses the output relative to ground. In the circuit 1600, here a current mirror having the element 2620 and 1625 of the circuit 1600 is sensing the output relative to this point. So this current mirror 1620 actually moves up and down with the output.

So, when the high side device 1600 is on, the output is going to be near supply. So when the output begins to fall, this is similar to before, as the cut-off is being source switched by element NFET 1625 so when the output begins to fall, Vg is at a fixed bias with respect to Vout. So Vg of V1 begins to fall which means that this device cuts off at just the right moment.

Turning to FIG. 16C, illustrated are simulation results, output going down so the gate falls really fast and its gets a huge current spike to discharge the gate, and once the output goes just a little bit below the boost supply voltage the current dies at just the right moment.

Figure 17:
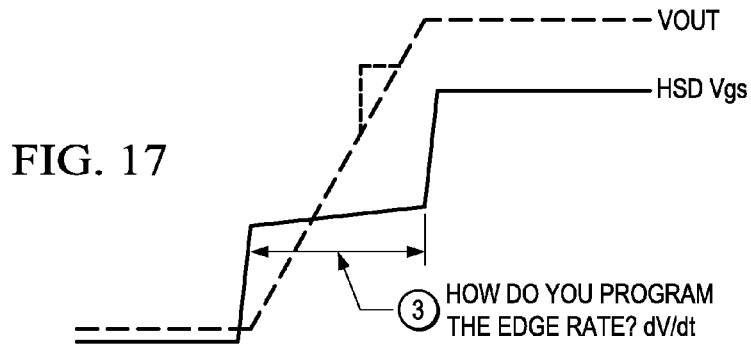
FIG. 17 illustrates a transition risk for a high side driver.

Turning to FIG. 17, illustrated is a transition risk for a high side driver.

Figure 18A:
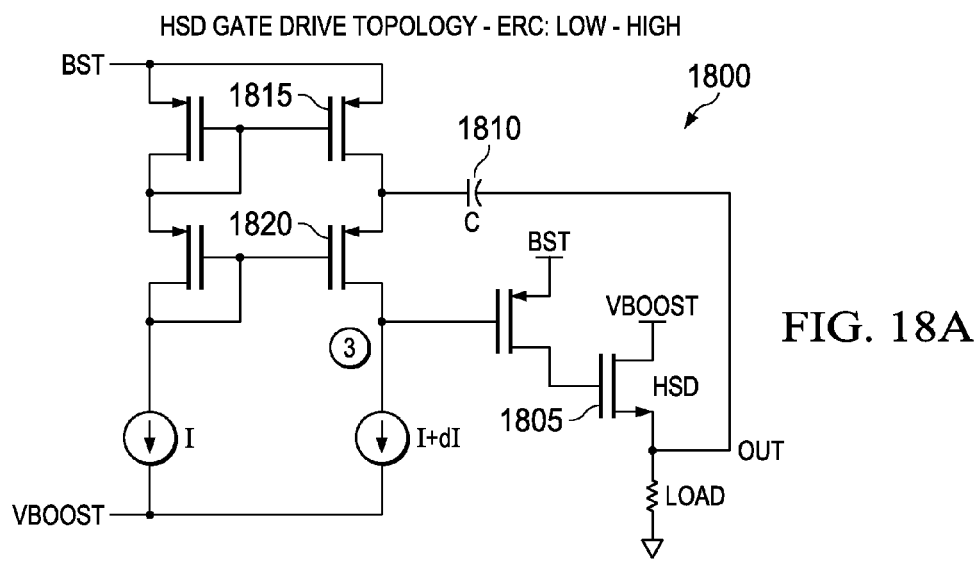
Figure 18B:
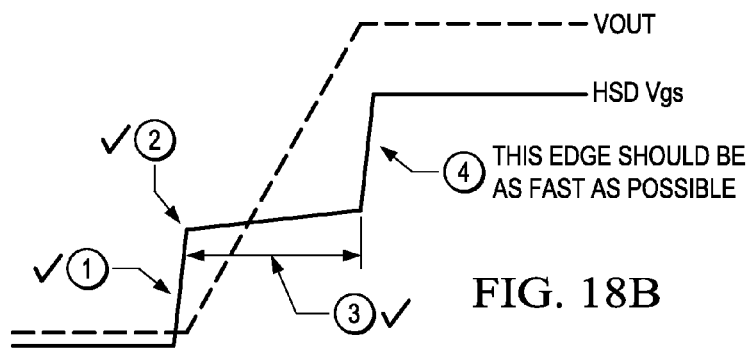

Turning to FIG. 18A-18C, illustrated is a high side driver topology 1800 with an edge transition of low to high and its associated waveforms. The circuit 1800 employs a capacitive feedback approach, which injects and compares against di through a capacitor 1810. However, because the high side device 1805 is NMOS and its non-inverting, right so it is needed to take out or add an inversion in our feedback loop to compensate for the inverting behavior of the high side NMOS device.

Therefore, before being injected, unlike the capacitor 705 of the circuit 700 which injected into the gate of M1 and M2 of 700, here, rather than injecting into the gate, here to change the inversion point the circuit has injected into its drain of PFET 1815. Therefore, these two are cascode devices, so the circuit has current injected into the source of the cascode device, and so from node cap to node, there is a non-inverting. If PFET 1815 is pulled up, PFET 1820 this will go up; if PFET 1815 pulls down, node 3t will go down.

Figure 19A:
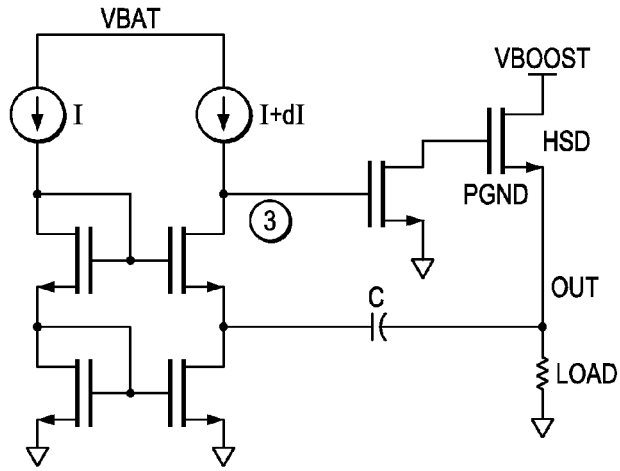
Figure 19B:
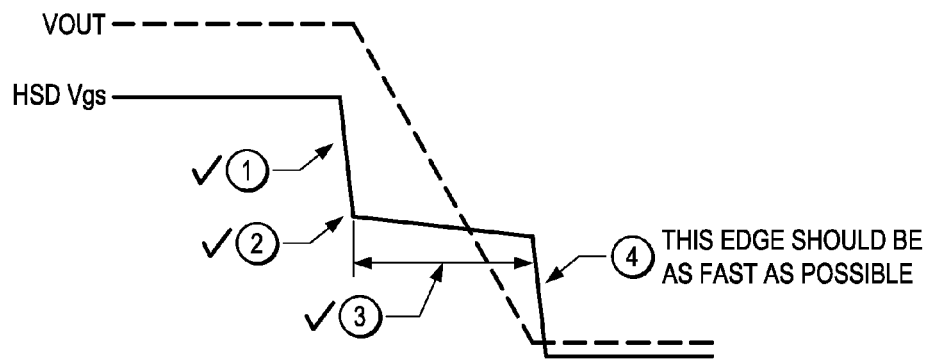

FIGS. 19A-19C illustrate a HDS driver technology that is for a high to low transition that also uses capacitive feedback and its associated waveforms.

Figure 20:
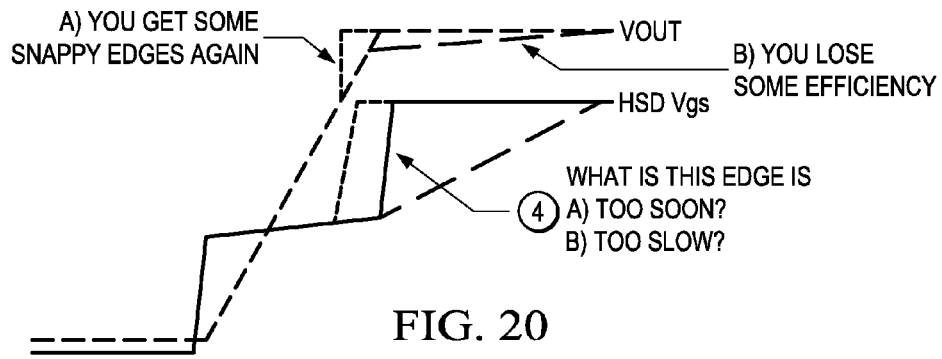
FIG. 20 illustrates transition risks of a final charging of the output FET.

FIG. 20 illustrates transition risks of a final charging of the output FET. The fourth transition is going to turn the device on all the way, or go ahead and turn the device off all the way.

Figure 21A:
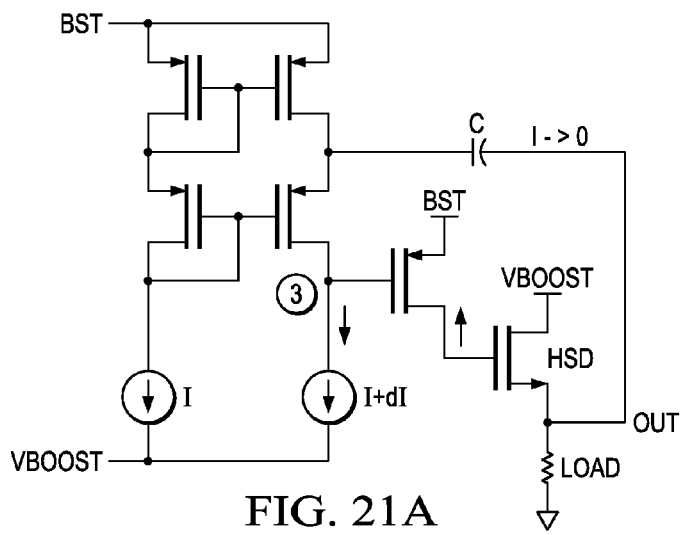
FIG. 21A-21B illustrates a high side equivalent of FIGS. 7A and 7B.
Figure 21B:
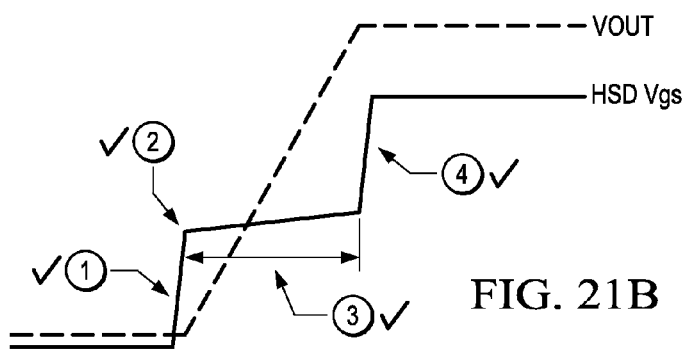

FIG. 21A-21B illustrates a high side equivalent of FIGS. 7A and 7B.

Figure 22A:
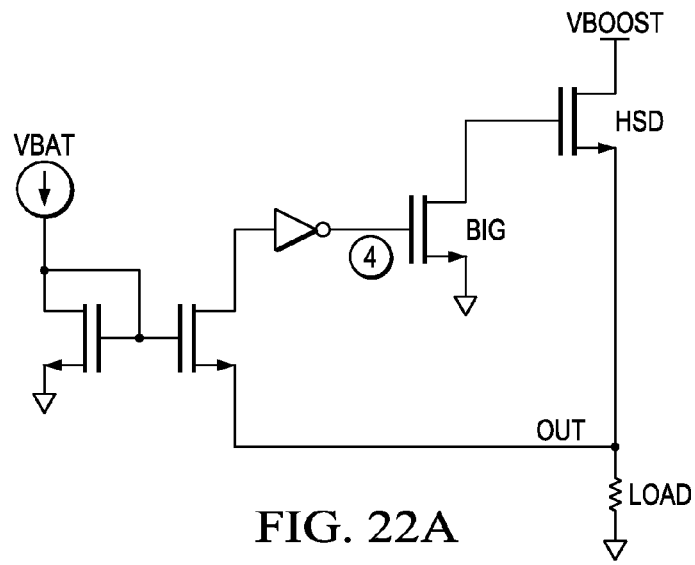
FIG. 22A-22B the high side equivalent of FIGS. 10A and 10B.
Figure 22B:
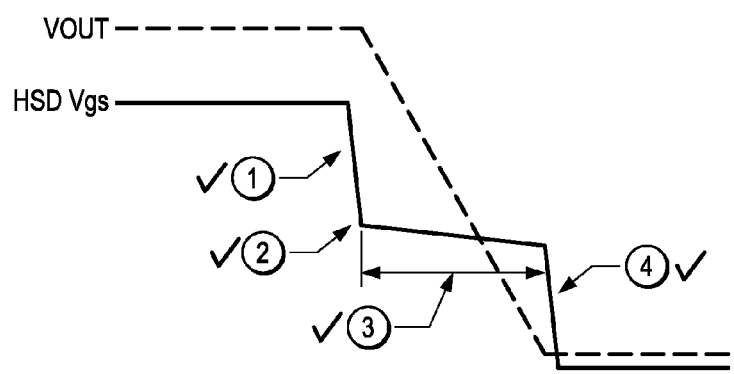

FIGS. 22A-22B the high side equivalent of FIGS. 10A and 10B.

FIG. 22C waveform from 22A and 22B.

Figure 23:
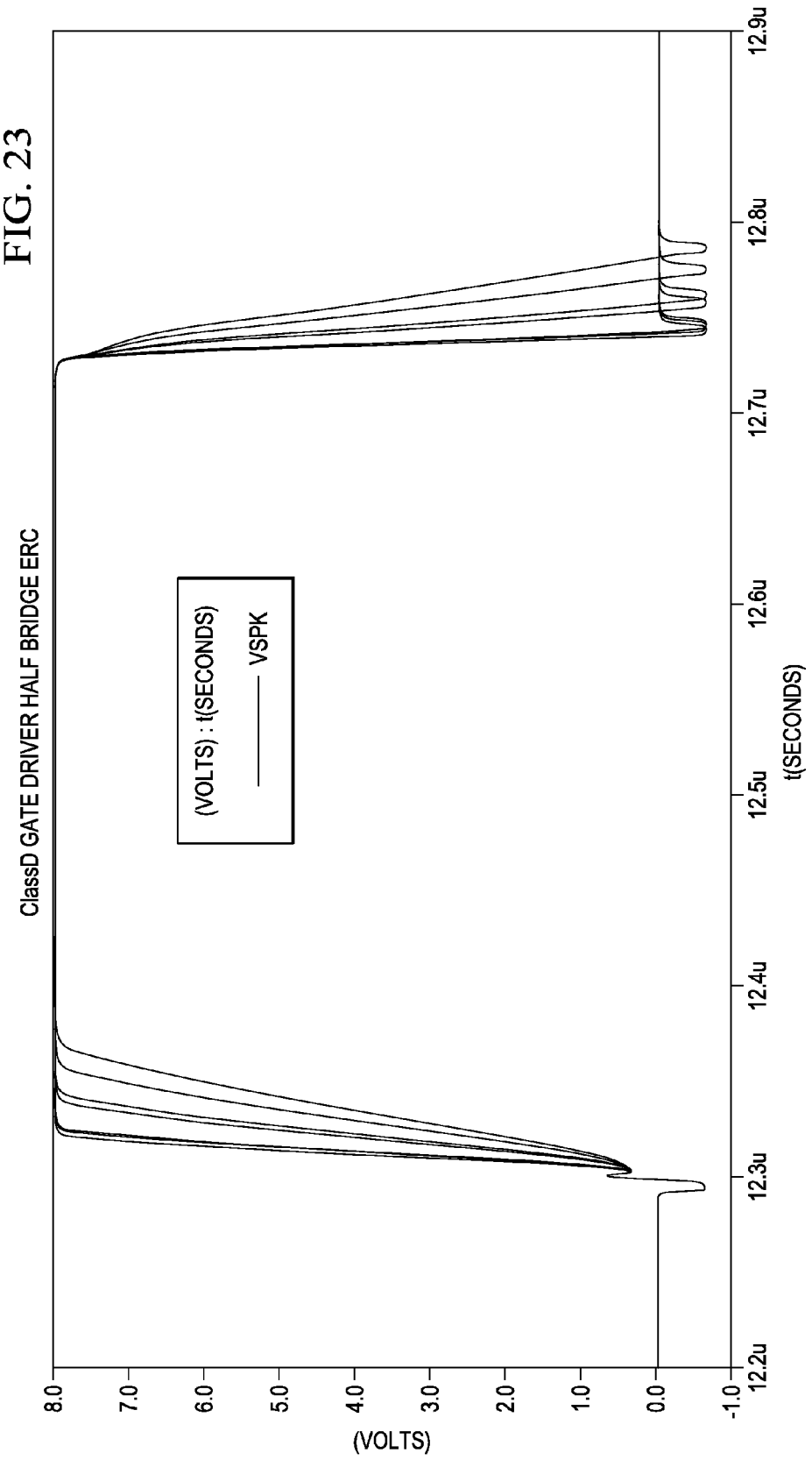
FIG. 23 shows a family of slopes is directly proportion to the DI 720 of FIG. 7A.

FIG. 23 shows a family of slopes is directly proportion to the DI 720 of FIG. 7A;

FIG. 24 extracts the slope of FIG. 23, including hand calculation vs. simulation.

FIG. 25A represents a prior art slowing down of voltage transition that create an unnecessary delay as recognized by the current inventor, thereby leading to the undesired distortion.

FIG. 25B is a comparison between the prior art and the current application of FIGL 1B.

FIG. 25C is simulation results that corresponds to FIG. 25B.

Figure 1A:
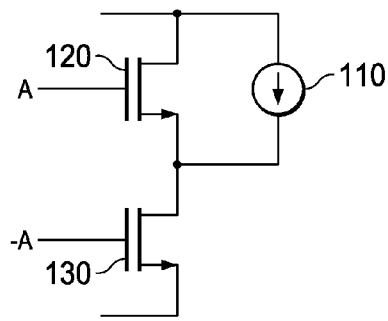
FIGS. 1A and 1B illustrate problems being addressed in the present application.
Figure 1B:
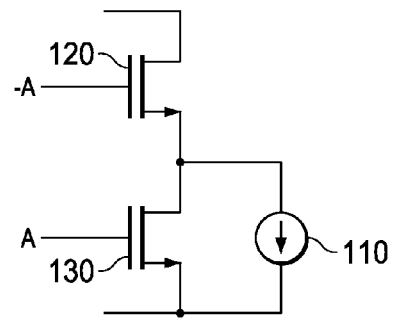
Figure 26A:
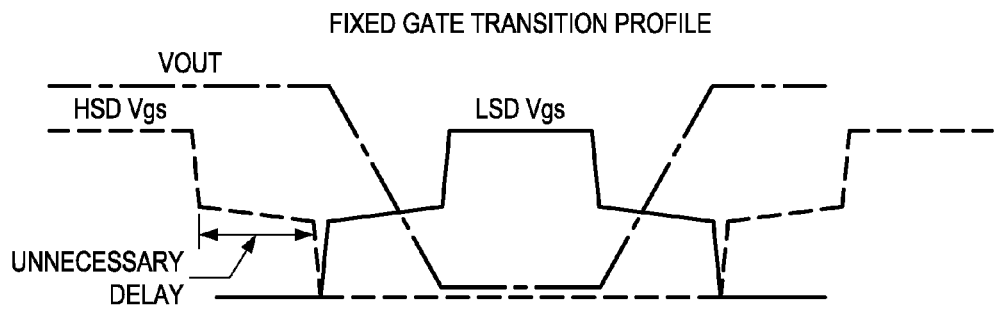
FIG. 26A-26B for a change load condition from FIG. 1B to FIG. 1A.
Figure 26B:
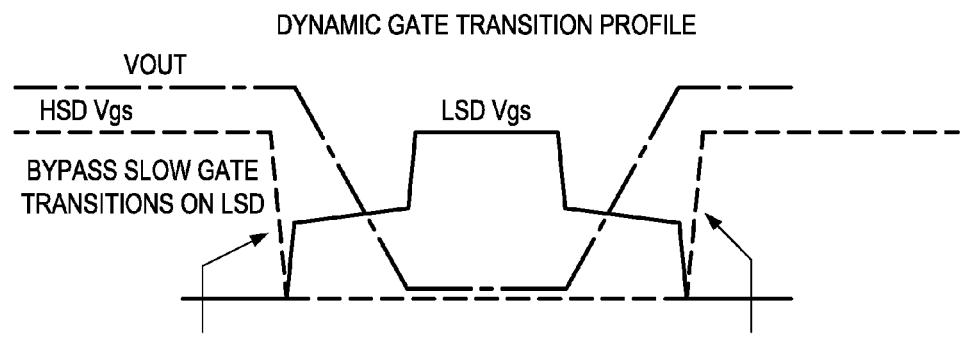

FIGS. 26A-26B for a change load condition from FIG. 1B to FIG. 1A.

Figure 26C:
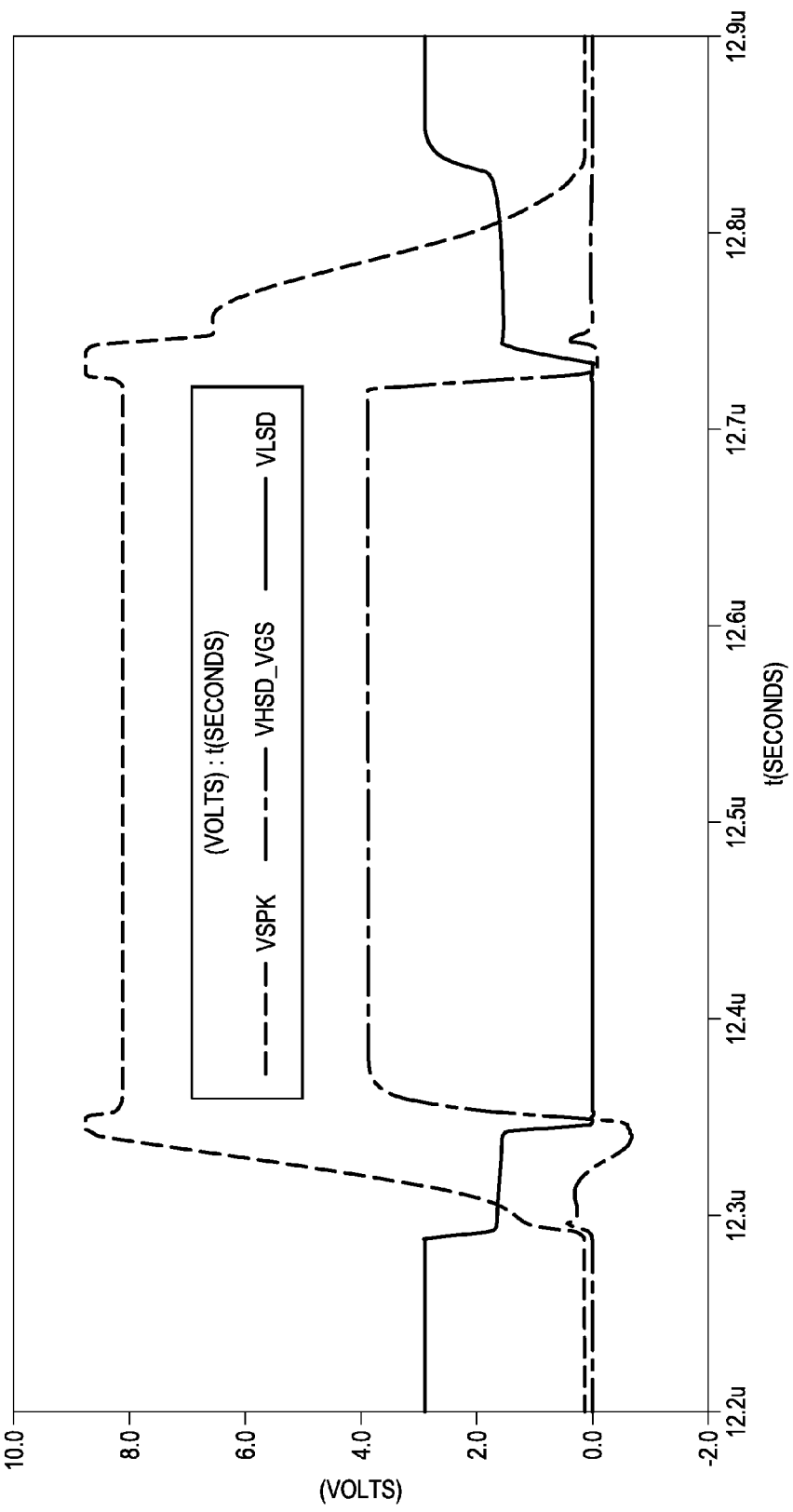
FIG. 26C is simulation results that corresponds to FIG. 25B.

FIG. 26C is simulation results that corresponds to FIG. 25B.

FIGS. 27A and 27B illustrates the interconnections of the various FIGS. of the present application for an edge rate controlled driver. As is illustrated in FIGS. 27A and 27B, the circuits of the various circuits are coupled together to create a high and low side driver. Please note that switches 2705 and 2710 implement an on-off functionality, as would be understood by those of skill in the art.

Those skilled in the art to which this application relates will appreciate that other and further additions, deletions, substitutions and modifications may be made to the described embodiments.

What is claimed is:

1. An apparatus, comprising:
   a load;
   an output FET having a drain coupled to the load;
   a first and second of a pair strong FETs, wherein
   a) a source of the first of the pair of the strong FETs is coupled to the load;
   b) a drain of the first of the pair of the strong FETs is coupled to the source of the second of the pair of the strong FETs;
   the drain of the second of the pair of the strong FETs is coupled to a gate of the output FET; and
   a fixed current mirror is coupled to the gate of the first of the pair of the strong FETs.

2. The apparatus of claim 1, wherein a gate of the second of the pair of the strong FETs receives a data signal.

3. The apparatus of claim 1, wherein a transistor of the current source has a smaller current gain than a gain of the first of the pair of the strong FETs.

4. The apparatus of claim 1, wherein the output FET is an NFET.

5. The apparatus of claim 1, wherein the apparatus is a low side device that sets a transition at a selected point so as to avoid overcharging the gate of the output FET.

6. The apparatus of claim 1, wherein voltage at the gate of the current mirror and the gate of the first of the pair of the strong FETs is substantially fixed.

7. The apparatus of claim 1, wherein the source of the second of the pair of the strong FETs has to be at, a higher potential than the gate of the second of the pair of the strong FETs to be on, so wherein data at the gate of the second of the pair of the strong FETs comes in low, current is applied to the load, which has a voltage at the source of the first of the pair of the strong FETs, wherein the first of the pair of the strong FETs is driven off, a voltage occurs across the first of the pair of the strong FETs, which couples the source of the second of the pair of the strong FETs to a low voltage, thereby turning off the second of the pair of the strong FETs.

8. The apparatus of claim 1, wherein the strong FETs are PFETs.

9. The apparatus of claim 1, wherein the apparatus comprises a low side driver.

10. The apparatus of claim 1, wherein the current mirror is configured to cut off a transition of the low side driver.

11. An apparatus, comprising:
   a load;
   an output FET having a drain coupled to the load;
   a first and second of a pair strong FETs, wherein
   a) a drain of the first of the pair of the strong FETs is coupled to the output FET;
   b) a source of the first of the pair of the strong FETs is coupled to the drain of the second of the pair of the strong FETs;
   the source of the of the pair of the strong FETs is coupled to the load; and
   a fixed current mirror is coupled to the gate of the second of the pair of the strong FETs.

12. The apparatus of claim 11, wherein a gate of the first of the pair of the strong FETs receives a data signal.

13. The apparatus of claim 11, wherein a transistor of the current source has a smaller current gain than a gain of the first of the pair of the strong FETs.

14. The apparatus of claim 11, wherein the current source is coupled to a supply voltage and the source of the output FET is coupled to a ground.

15. The apparatus of claim 11, wherein the apparatus is a low side device that sets a transition at a selected point so as to not avoid a late turn-off.

16. The apparatus of claim 11, wherein voltage at the gate of the current mirror and the gate of the second of the pair of the strong FETs is substantially fixed.

17. The apparatus of claim 11, wherein the source of the first of the pair of the strong FETs has to be at a lower potential than the gate of the first of the pair of the strong FETs to be on, so wherein data at the gate of the first of the pair of the strong FETs comes in high, this turns off the output FET, raises the voltage at the load, wherein the fixed gate and rising source of the current mirror turns off the second of the pair of the strong FETs, which drives the output FET off again.

18. An apparatus, comprising a load;
   an output FET having a drain coupled to the load;
   a first and second of a first pair strong FETs, wherein:
   a) a source of the first of the first pair of the strong FETs is coupled to the load;
   b) a drain of the first of the first pair of the strong FETs is coupled to the source of the second of the of the first pair of the strong FETs;
   the drain of the second FET of the first pair of the strong FETs is coupled to a gate of the output FET; and
   a first fixed current mirror is coupled to the gate of the first of the first pair of the strong FETs;
   a first and second of a second pair strong FETs, wherein:
   a) a drain of the first of the second pair of the strong FETs is coupled to the gate of the output FET;
   b) a source of the first of the second pair of the strong FETs is coupled to the drain of the second of the of the second pair of the strong FETs;
   the source of the second of the second pair of the strong FETs is coupled to the load; and
   wherein the source of the second of the second pair of the strong FETs is shorted together with a drain of the output FET.

19. The apparatus of claim 18, wherein the gate of the second FET of the first pair of strong FETs receives a data signal.

20. The apparatus of claim 18, wherein the gate of the second FET of the second pair of the strong FETs receives a data signal.

* * * * *